(12) United States Patent
Estacio et al.

(10) Patent No.: US 10,943,855 B2
(45) Date of Patent: Mar. 9, 2021

(54) ELECTRONIC DEVICE PACKAGING WITH GALVANIC ISOLATION

(71) Applicant: SEMICONDUCTOR COMPONENTS INDUSTRIES, LLC, Phoenix, AZ (US)

(72) Inventors: Maria Cristina Estacio, Lapulapu (PH); Marlon Bartolo, Lapu Lapu (PH); Maria Clemens Ypil Quinones, Cebu (PH); Chung-Lin Wu, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/102,922

(22) Filed: Aug. 14, 2018

(65) Prior Publication Data

US 2019/0067171 A1 Feb. 28, 2019

Related U.S. Application Data

(60) Provisional application No. 62/549,122, filed on Aug. 23, 2017.

(51) Int. Cl.
*H01L 23/48* (2006.01)
*H01L 23/495* (2006.01)
(Continued)

(52) U.S. Cl.
CPC ........ *H01L 23/49541* (2013.01); *H01L 23/48* (2013.01); *H01L 23/49531* (2013.01);
(Continued)

(58) Field of Classification Search
CPC combination set(s) only.
See application file for complete search history.

(56) References Cited

U.S. PATENT DOCUMENTS

| 6,021,158 A | 2/2000 | Schurr et al. |
| 6,137,839 A | 10/2000 | Mannering et al. |

(Continued)

FOREIGN PATENT DOCUMENTS

WO 2014036594 A1 3/2014

OTHER PUBLICATIONS

Extended European Search Report for European Application No. 18190009.3, dated Nov. 29, 2018, 7 pages.

(Continued)

*Primary Examiner* — Fernando L Toledo
*Assistant Examiner* — Valerie N Newton
(74) *Attorney, Agent, or Firm* — Brake Hughes Bellermann LLP

(57) ABSTRACT

In a general aspect, an electronic device assembly can include a dielectric substrate having a first surface and a second surface opposite the first surface and a leadframe including: a first leadframe portion including a first plurality of signal leads; and a second leadframe portion including a second plurality of signal leads. The substrate can be coupled with a subset of the first plurality of signal leads and a subset of the second plurality of signal leads. Signal leads of the first plurality of signal leads, other than the subset of the first plurality of signal leads, can be spaced from the dielectric substrate. Signal leads of the second plurality of signal leads, other than the subset of the second plurality of signal leads, can be spaced from the dielectric substrate. The assembly can further include first and second semiconductor die that are electrically coupled with the substrate and the leadframe portions.

13 Claims, 15 Drawing Sheets

(51) Int. Cl.
  *H01L 23/00* (2006.01)
  *H01L 23/538* (2006.01)

(52) U.S. Cl.
  CPC ........ *H01L 23/49575* (2013.01); *H01L 24/48* (2013.01); *H01L 23/538* (2013.01); *H01L 23/5384* (2013.01); *H01L 2224/48245* (2013.01); *H01L 2224/85207* (2013.01); *H01L 2924/00014* (2013.01); *H01L 2924/13091* (2013.01)

(56) References Cited

U.S. PATENT DOCUMENTS

| | | |
|---|---|---|
| 6,385,235 B1 | 5/2002 | Scott et al. |
| 7,915,935 B1 | 3/2011 | Menon et al. |
| 9,735,112 B2 | 8/2017 | Constantino et al. |
| 2009/0027243 A1* | 1/2009 | Leung .................... H01L 23/48 341/100 |
| 2009/0213914 A1 | 8/2009 | Dong et al. |
| 2010/0054345 A1 | 3/2010 | Yamamoto |
| 2010/0190357 A1 | 7/2010 | Hashim |
| 2011/0011934 A1 | 1/2011 | Iwamura et al. |
| 2011/0069604 A1 | 3/2011 | Schmukler et al. |
| 2011/0095620 A1* | 4/2011 | Fouquet ................. H01F 19/08 307/104 |
| 2013/0301690 A1 | 11/2013 | Shrestha |
| 2015/0200162 A1* | 7/2015 | Constantino ...... H01L 23/49537 257/532 |
| 2016/0284631 A1* | 9/2016 | Cabahug ............. H01L 25/0655 |

OTHER PUBLICATIONS

Partial Search Report and Invitation to Pay Further Search Fee for European Application No. 18190121.6, dated Dec. 18, 2018, 15 pages.

Extended European Search Report for European Application No. 18190121.6, dated Mar. 27, 2019, 13 pages.

* cited by examiner

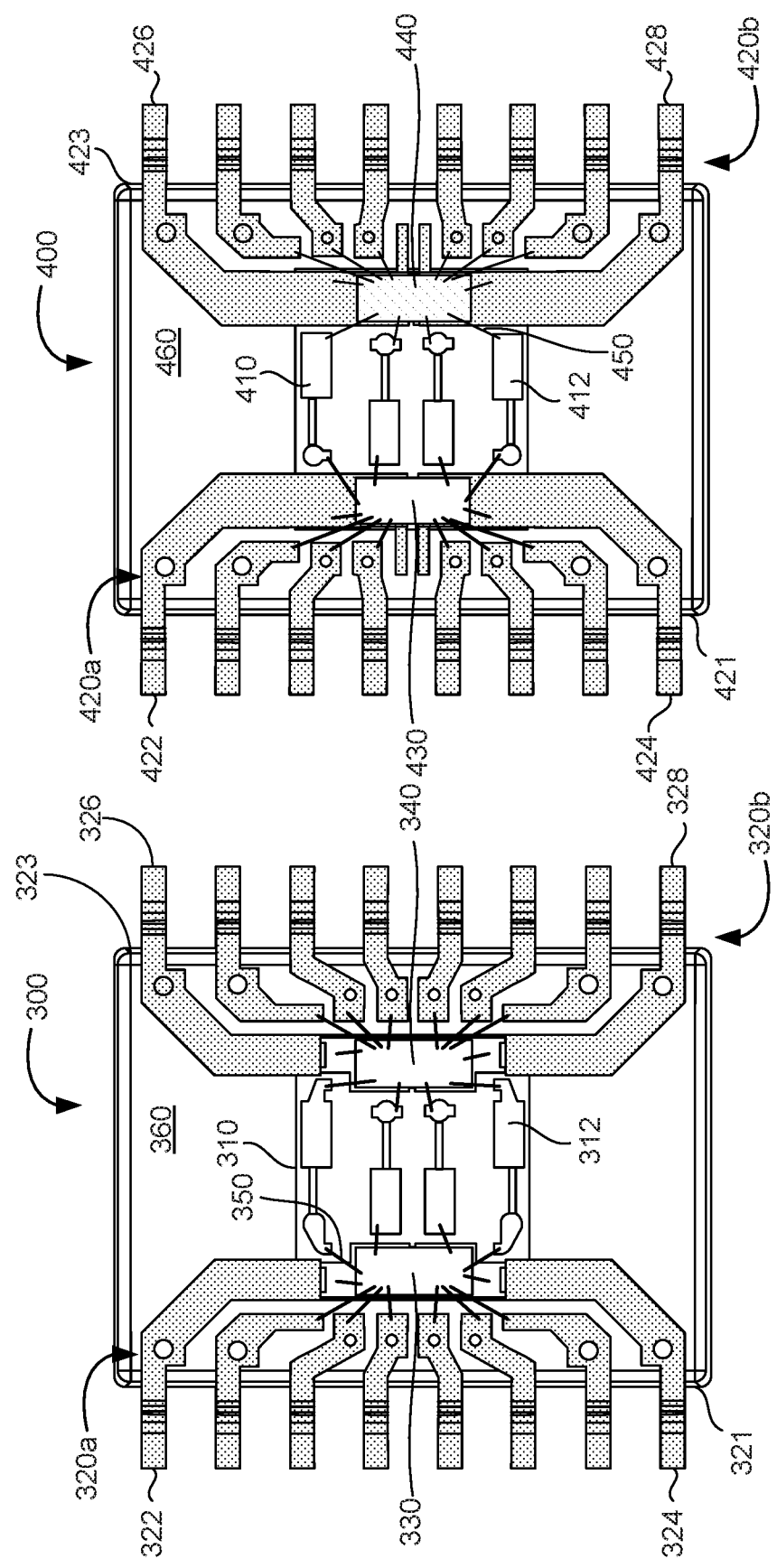

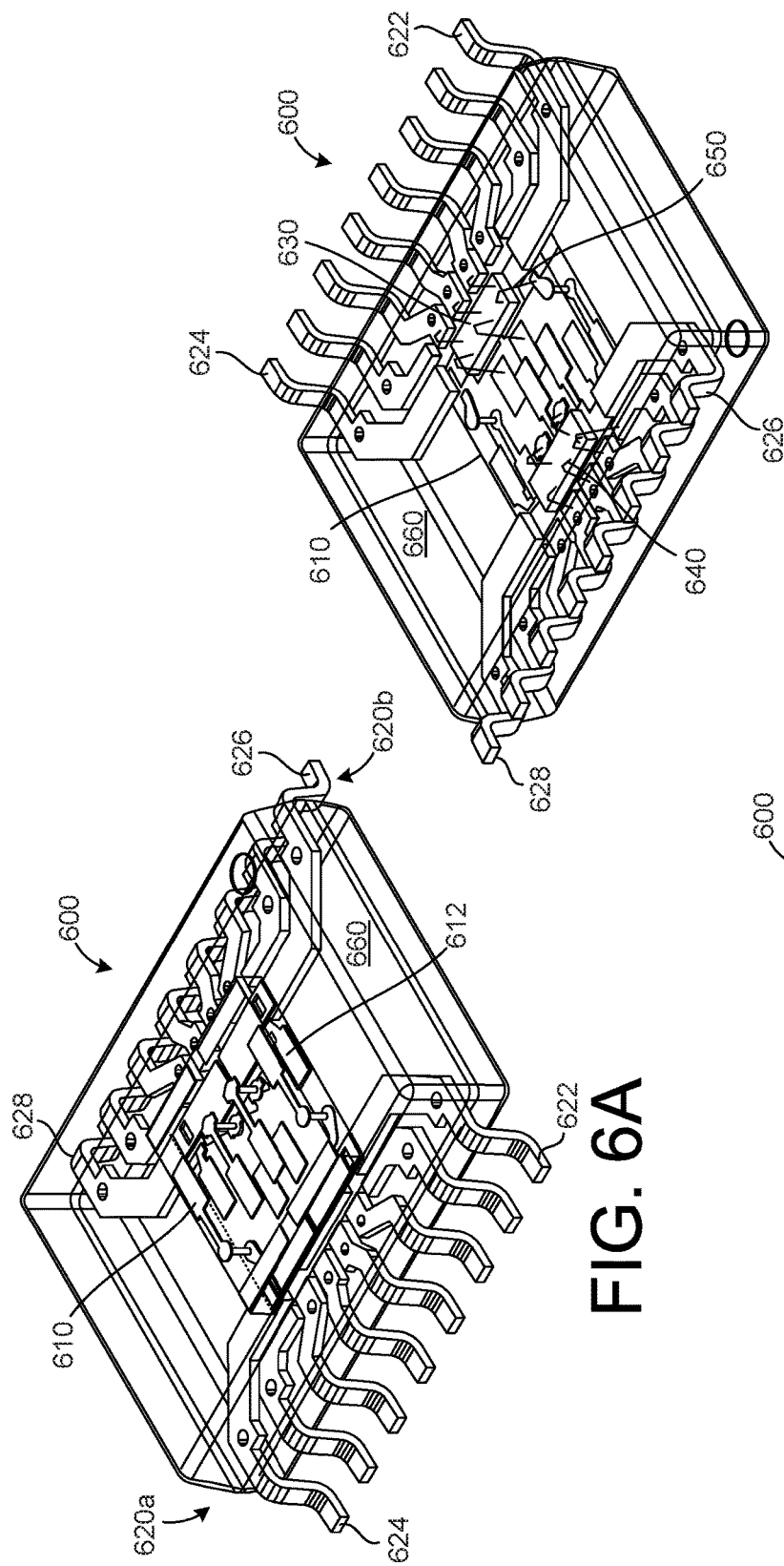
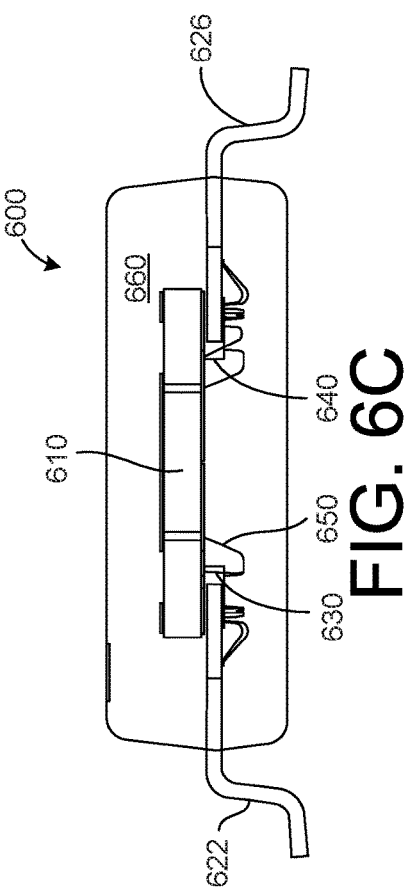
FIG. 6B
FIG. 6A
FIG. 6C

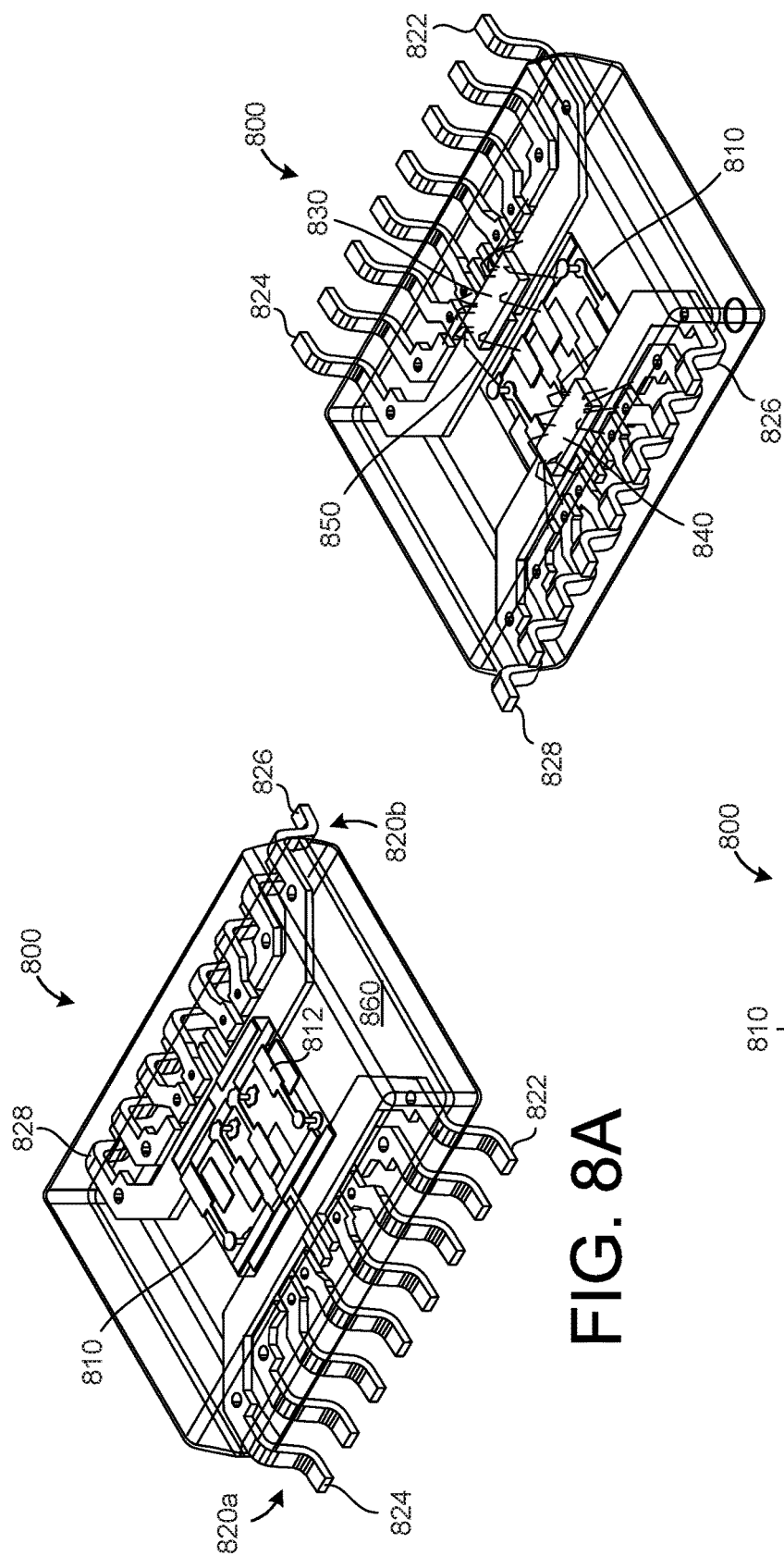
FIG. 8A
FIG. 8B
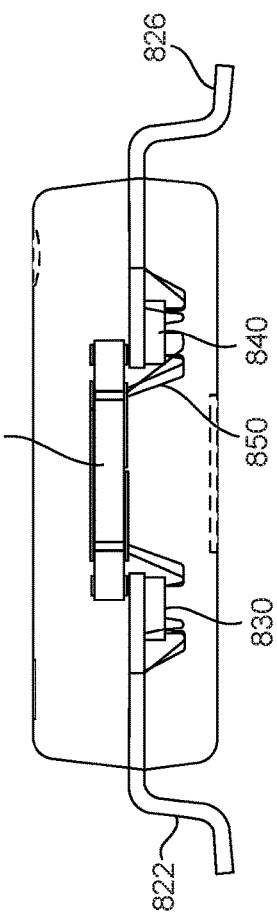
FIG. 8C

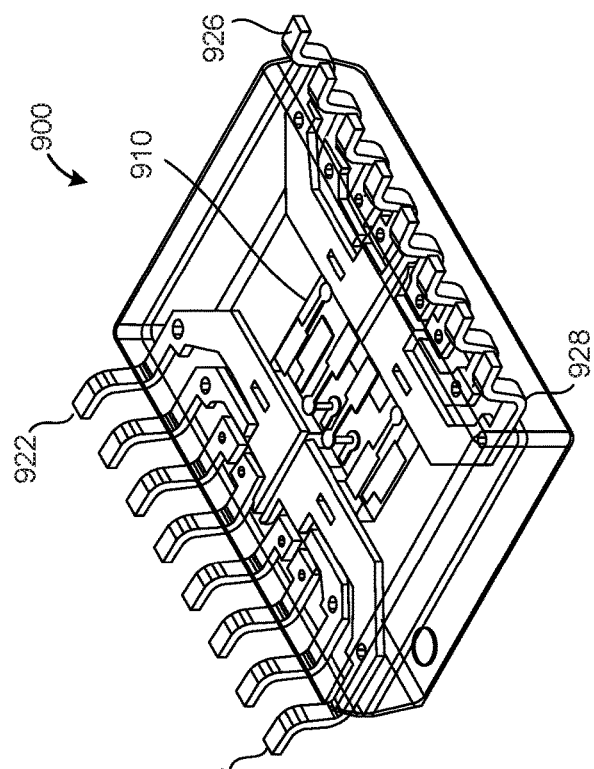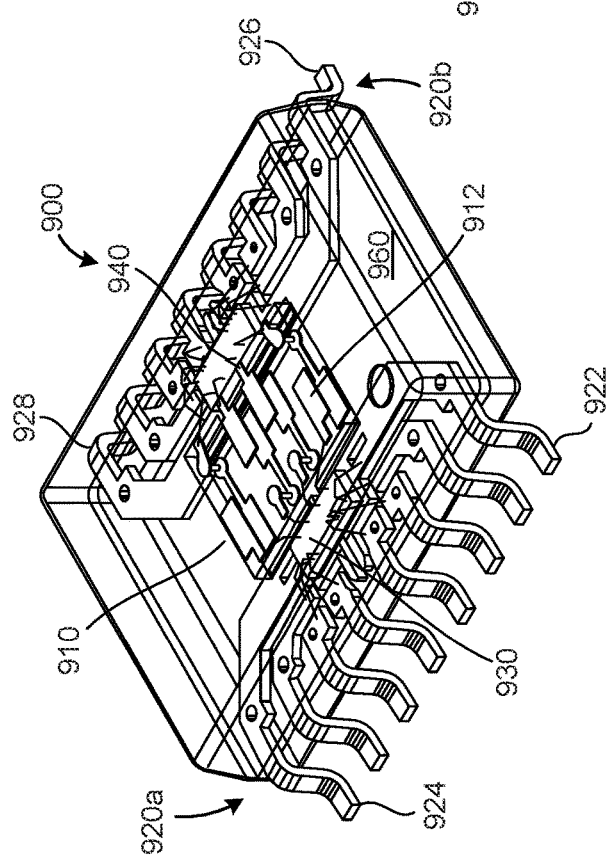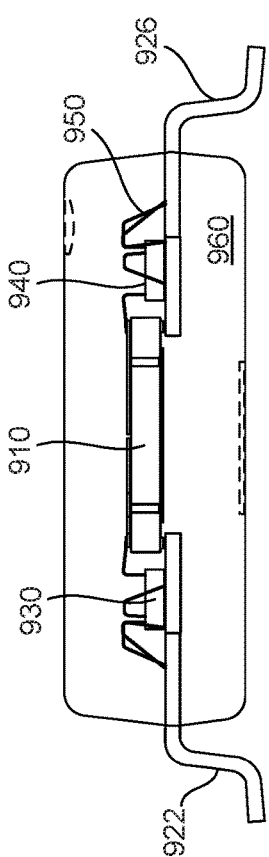

ELECTRONIC DEVICE PACKAGING WITH GALVANIC ISOLATION

RELATED APPLICATION

This application claims priority to and the benefit of U.S. Provisional Application No. 62/549,122, filed Aug. 23, 2017, which is hereby incorporated by reference in its entirety.

TECHNICAL FIELD

This description relates to circuits for packaging, and associated method of manufacture, for electronic device assemblies including galvanic isolation (e.g., capacitive isolation) between semiconductor die included in such assemblies.

BACKGROUND

Communication of data, such as control, feedback and status information, in automotive and industrial applications or electrical systems can include communicating data between different power domains, where such power domains can have substantial differences in voltages used in those power domains (e.g., tens of thousands of volts in some implementations). For instance, a first data communication circuit, in a first power domain, can communicate data to a second data communication circuit, in a second power domain. In such applications, in order to prevent (block, etc.) stray currents, such as currents due to ground potential differences and/or currents from alternating-current (AC) power from passing between the first data communication circuit and the second data communication circuit (e.g., between the different power domains), the first data communication circuit and the second data communication circuit can be galvanically (e.g., capacitively) isolated.

SUMMARY

In a general aspect, an electronic device assembly can include a dielectric substrate having a first surface and a second surface opposite the first surface. The dielectric substrate can include a first unidirectional isolation channel defined thereon, the first unidirectional isolation channel having an input terminal and an output terminal; and a second unidirectional isolation channel defined thereon, the second unidirectional isolation channel having an input terminal and an output terminal. The assembly can further include a leadframe having a first leadframe portion and a second leadframe portion. The first leadframe portion can include a first plurality of signal leads. A first corner of the first surface of the dielectric substrate can be coupled with a first signal lead of the first plurality of signal leads. A second corner of the first surface of the dielectric substrate can be coupled with a second signal lead of the first plurality of signal leads. The second leadframe portion can include a second plurality of signal lead. A third corner of the first surface of the dielectric substrate can be coupled with a first signal lead of the second plurality of signal leads. A fourth corner of the first surface of the dielectric substrate can be coupled with a second signal lead of the second plurality of signal leads. The assembly can further include a first semiconductor die that is electrically coupled, using respective wire bonds, with at least one signal lead of the first plurality of signal leads, the input terminal of the first unidirectional isolation channel, and the output terminal of the second unidirectional isolation channel. The assembly can still further include a second semiconductor die being electrically coupled, using respective wire bonds, with at least one signal lead of the second plurality of signal leads, the output terminal of the first unidirectional isolation channel, and the input terminal of the second unidirectional isolation channel.

BRIEF DESCRIPTION OF THE DRAWINGS

FIGS. 3, 4 and 5 are plan view diagrams of electronic device assemblies.

FIGS. 6A, 6B and 6C are diagrams illustrating an electronic device assembly.

FIGS. 8A, 8B and 8C are diagrams illustrating another electronic device assembly.

FIGS. 9A, 9B and 9C are diagrams illustrating another electronic device assembly.

DETAILED DESCRIPTION

This disclosure is directed to electronic device assemblies (assemblies) and methods for producing such assemblies. The example assemblies describe herein can be used to implement electronic devices that bi-directionally communicate data (e.g., for multiple data channels) using unidirectional, galvanically isolated channels (e.g., two unidirectional differential isolation channels per bi-directional channel). For instance, the assemblies described herein can be used for devices that communicate data between different power domains, such as in industrial and or automotive applications, including power conversion, gate drivers, motor control, etc. For instance, data can be communicated from a first circuit (e.g., such as a first integrated circuit (IC) in a first power domain) to a second circuit (e.g., a second integrated circuit (IC) in a second power domain) using a first unidirectional isolation channel, while data from the second circuit to the first circuit can be communicated using a second unidirectional isolation channel.

In the approaches described herein, galvanic isolation between data communication circuits (and associated power domains) can be achieved using a plurality of capacitors defined on a common dielectric substrate (substrate), such as a printed circuit substrate (e.g., ceramic, FR4, etc.). For instance, in some implementations, capacitors can be defined on the substrate for each of two unidirectional differential isolation channels (e.g., four total capacitors, including one for each of the positive differential signals and one for each of the negative differential signals). In some implementations, additional circuits (integrated circuits) and isolation channels can be included. Using the approaches described herein, high distance through insulation can be achieved due to the thickness of the substrate used to implement the isolation capacitors. Such isolation channels can be formed using printed circuit traces and vias (through the substrate), to form and interconnect capacitor electrodes.

Figure 1:
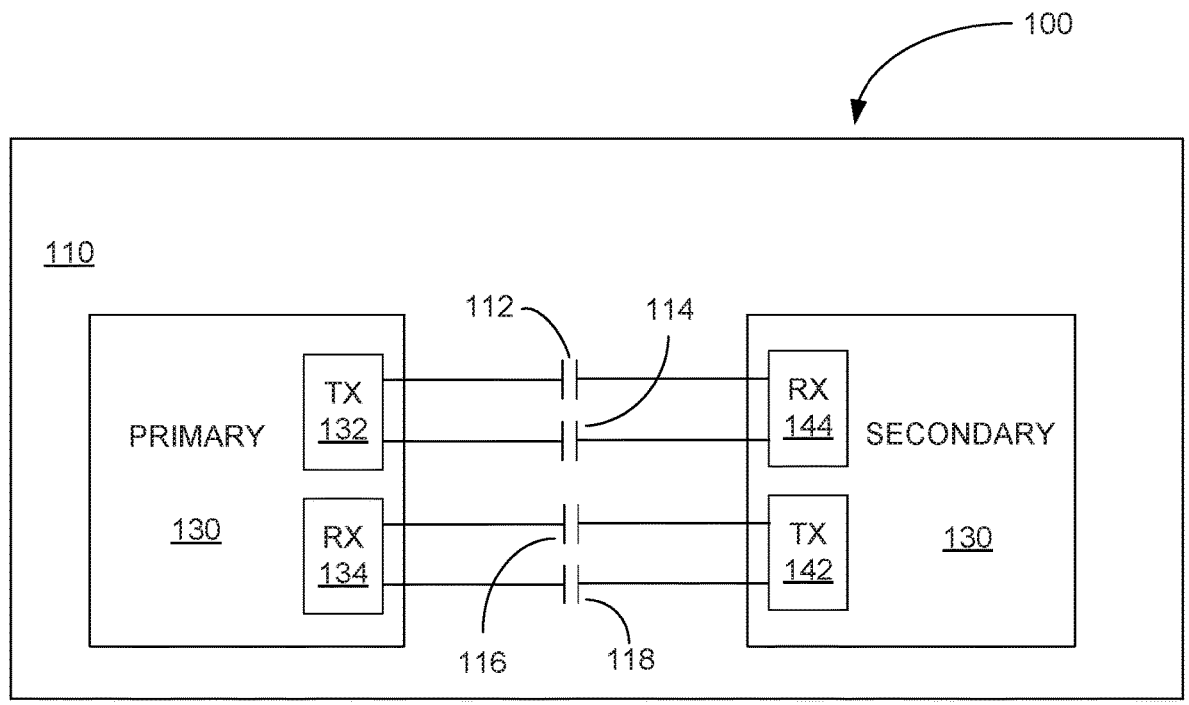
FIGS. 1 and 2 are block diagrams schematically illustrating data communication device assemblies.

FIG. 1 is a block diagram illustrating an electronic device assembly (assembly) 100. As shown in FIG. 1, the assembly 100 includes a substrate 110, a primary circuit 130 and a secondary circuit 140. The substrate 110 can be a printed circuit substrate, such as a ceramic substrate, an FR4 substrate, or any appropriate substrate material having dielectric (electrical insulation) properties. The circuit 130 and the secondary circuit 140 can be implemented on respective integrated circuits (ICs). The primary circuit 130 (e.g., a first IC) and the secondary 140 (e.g., a second IC), as shown in FIG. 1, can be disposed on (coupled with, physically coupled with, etc.) the substrate 110. Further, the primary circuit 130 and the secondary circuit 140 can be electrically coupled with capacitor pairs included on the substrate 110 using wire bonds, circuit traces and/or conductive vias included on the substrate 110. In some implementations, other electrical connections between the respective ICs and the substrate 110, such as solder connections, can be used.

As shown in FIG. 1, capacitor pairs for two unidirectional isolation channels can be defined (formed, implemented, etc.) on the substrate 110. For instance, in the device 100, a first capacitor pair can include capacitors 112 and 114, and a second capacitor pair can include capacitors 116 and 118. The capacitors 112-118 can be formed using respective capacitor electrodes (e.g., printed circuit traces) disposed on opposite sides of the substrate 110. In the device 100, a first unidirectional isolation channel can include the first capacitor pair (including the capacitors 112 and 114), while a second unidirectional isolation channel can include the second capacitor pair (including the capacitors 116 and 118). The first and second unidirectional isolation channels can be used for bi-directional data communication (e.g., between two different power domains).

As shown in FIG. 1, in this example, the primary circuit 130 includes a transmitter (TX) 132 and a receiver (RX) 134, while the secondary circuit includes a TX 142 and a RX 144. In the device 100, the capacitors 112 and 114 can provide differential series coupling between the TX 132 of the primary circuit 130 and the RX 144 of the secondary circuit 140. The capacitors 116 and 118 can provide differential series coupling between the TX 142 of the secondary data circuit 140 and the RX 134 of the primary circuit 130.

In the device 100, the TX 132, the capacitors 112 and 114, and the RX 144 can be referred to as being included in the first (unidirectional) isolation channel, while the TX 142, the capacitors 116 and 118, and the RX 134 can be referred to as being in the second (unidirectional) isolation channel. In some implementations, such as the device 100, data can be respectively communicated in the first isolation channel and in the second isolation channel in a similar or same way. The specific approach used for data communication between the primary circuit 130 and the secondary circuit 140 will depend on the particular implementation.

Figure 2:
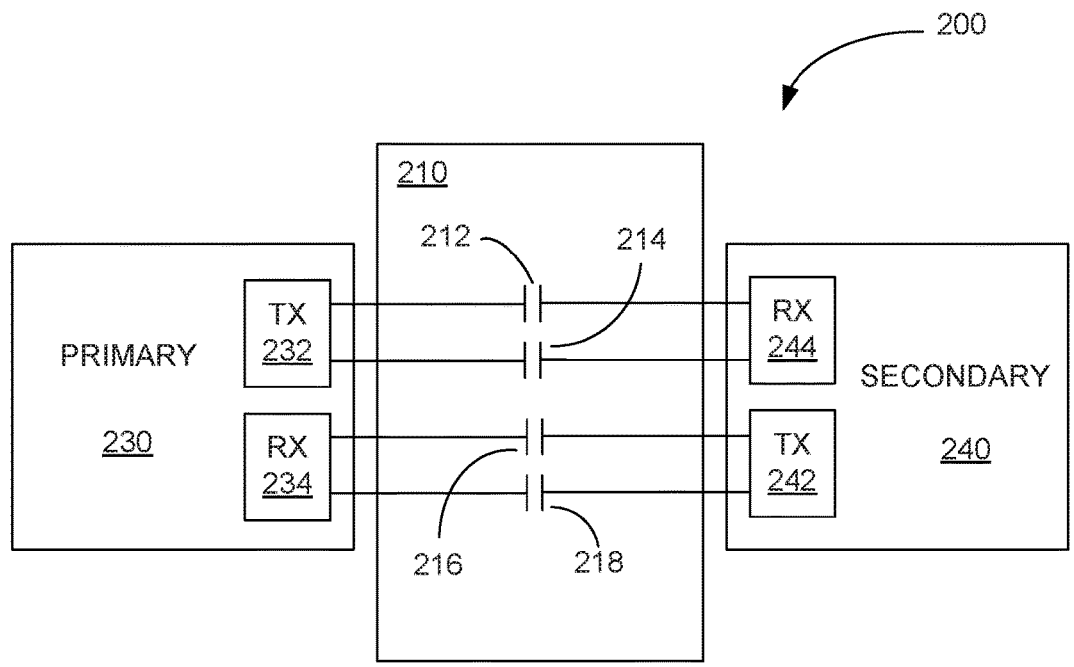

FIG. 2 is a block diagram illustrating another electronic device assembly (assembly) 200. As shown in FIG. 2, the assembly 200 includes a substrate 210, a primary circuit 230 and a secondary circuit 240. As with the substrate 110, the substrate 210 can be a printed circuit substrate, such as a ceramic substrate, an FR4 substrate, or any appropriate substrate material having dielectric (electrical insulation) properties.

Similar to the data communication device 100, the primary circuit 230 and the secondary 240 can be implemented on respective integrated circuits (ICs). In contrast to the circuits 130 and 140 of the device 100, the primary circuit 230 (e.g., a first IC) and the secondary circuit 240 (e.g., a second IC), as shown in FIG. 2, are not disposed on (coupled with, physically coupled with, etc.) the substrate 110. In some implementations, such as those described herein, the circuits (ICs) 230 and 240 of the device 200 can be disposed on a leadframe. Further, the primary circuit 230 and the secondary circuit 240 can be electrically coupled with capacitor pairs included in the substrate 230 using wire bonds, circuit traces and/or conductive vias included on the substrate 110.

As shown in FIG. 2, capacitor pairs for two unidirectional isolation channels of the device 200 can be defined (formed, implemented, etc.) on the substrate 210. In the device 200, a first capacitor pair can include capacitors 212 and 214, and a second capacitor pair can include capacitors 216 and 218. The capacitors 212-218 can be formed using respective capacitor electrodes disposed on opposite sides of the substrate 210 that are interconnected with vias and/or circuit traces formed on the substrate 210. In the device 200, a first unidirectional isolation channel can include a first capacitor pair including the capacitors 212 and 214, while a second unidirectional isolation channel can include a second capacitor pair including the capacitors 216 and 218. The first and second unidirectional isolation channels of the device 200 can be used for bi-directional data communication (e.g., between two different power domains).

As shown in FIG. 2, the primary circuit 230 includes a TX 232 and a RX 234. While the secondary circuit includes a TX 242 and a RX 244. In the device 200, the capacitors 212 and 214 can provide differential series coupling between the TX 232 of the primary circuit 230 and the RX 244 of the secondary circuit 240. Also in the device 200, the capacitors 216 and 218 can provide differential series coupling between the TX 242 of the secondary circuit 240 and the RX 234 of the primary circuit 230. In the device 200, the TX 232, the capacitors 212 and 214, and the RX 244 can be referred to as being included in the first (unidirectional) isolation channel, while the TX 242, the capacitors 216 and 218, and the RX 234 can be referred to as being in the second (unidirectional) isolation channel. Similarly as described above with respect to the device 100, in the device 200, data can be respectively communicated (unidirectionally communicated) in the first isolation channel (from the TX 232 to the RX 244) and in the second isolation channel (from the TX 242 to the RX 234) to implement bi-directional data communication.

Figure 5:
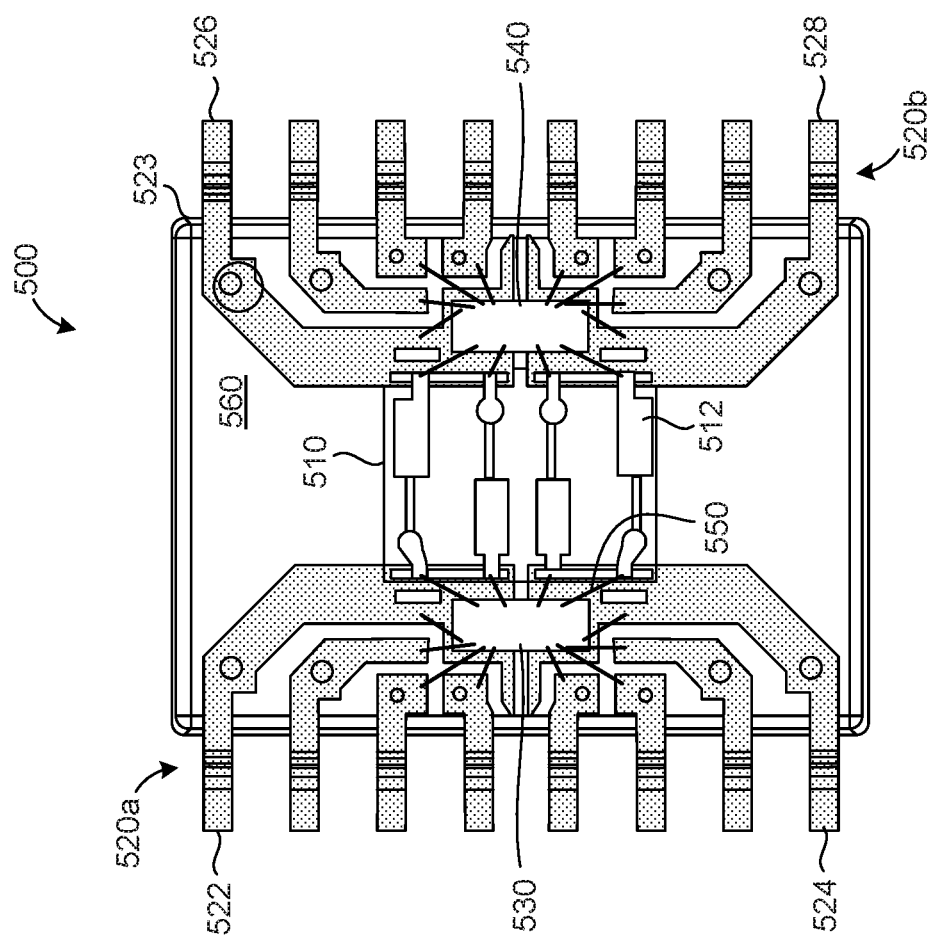

FIGS. 3, 4 and 5 are plan view diagrams of, respectively, electronic device assemblies (assemblies) 300, 400 and 500. FIGS. 6A-6C, 7A-7C, 8A-8C, 9A-9C, 10A-10C and 11 are diagrams illustrating, respectively, electronic device assemblies 600, 700, 800, 900, 1000 and 1100. In some implementations, the assemblies 300, 600 and 700 can be used to implement the assembly 100 of FIG. 1. In some implementations, the assemblies 400 and 500, 800, 900, 1000 and 1100 can be used to implement the assembly 200 of FIG. 2. In FIGS. 3-11, the assemblies, for purposes of illustration, are shown using ghosted (e.g., x-ray) views, such that internal features of the assemblies that would not be visible through a molding compound in an actual device are shown.

In FIGS. 3 and 4, the plan views of assemblies 300 and 400 are shown as a bottom-side (dead-bug) view of the assemblies, while the plan view of assembly 500 in FIG. 5 is shown as a top-side (live bug) view of the assembly. The assembly 300 in FIG. 3 corresponds with the assembly 600 of FIGS. 6A-6C, the assembly 400 in FIG. 4 corresponds with the assembly 800 of FIGS. 8A-8C, and the assembly 500 of FIG. 5, corresponds with the assembly 900 of FIGS. 9A-9C. The assemblies in FIGS. 3-11 are shown by way of example, and for purposes of illustration. In some implementations, features of one assembly can be implemented in another assembly (e.g., in addition to, or in place of existing features).

As shown in FIG. 3, the assembly 300 can include a dielectric substrate 310, a first leadframe portion 320a, a second leadframe portion 320b, a first semiconductor die 330, a second semiconductor die 340, wire bonds 350 and a molding compound 360. The substrate 310 can have a first surface (upward facing in FIG. 3) and a second surface opposite the first surface (downward facing in FIG. 3). As shown in FIG. 3, the substrate 310 can have printed circuit features 312 defined thereon, which can include copper traces (e.g., forming capacitor electrodes and/or attachment pads for coupling the substrate 310 with the leadframe portions 320a and 320b) and vias through the substrate 310. The printed circuit features 312 can define, on the substrate 310, a first unidirectional isolation channel an input terminal and an output terminal, such as discussed above with respect to FIGS. 1 and 2. The printed circuit features 312 can also define, on the substrate 310, a second unidirectional isolation channel an input terminal and an output terminal.

As shown in FIG. 3, the first leadframe portion 320a can include a plurality of signal leads that are linearly arranged along a first edge 321 of the assembly 300, while the second leadframe portion 320b includes a second plurality of signal leads are linearly arranged along a second edge 323 of the assembly 300. As shown in FIG. 3, the signal leads 322, 324, 326 and 328, which are at the ends of edges 321 and 323 (e.g., at the corners of the assembly 300) extend into the molding compound 360 and are coupled with the first (upward-facing) surface of the substrate 310, e.g. at respective corners of the first surface of the substrate 310. As also shown in FIG. 3, the other signal leads of the leadframe portions 320a and 320b, other than the signal leads 322, 324, 326 and 328, extend into the molding compound 360 put are pulled back from (spaced from, laterally space from, not in physical contact with, etc.) the substrate 310.

As shown in FIG. 3, the first semiconductor die 330 and the second semiconductor die 340 are also disposed on the first surface of the substrate 310 in the assembly 300. The wire bonds 350 electrically couple the first and second semiconductor die with the substrate 310 (e.g., with the input and output terminals of the isolation channels), and with the signal leads of the leadframe portions 320a and 320b.

As shown in FIG. 4, the assembly 400 can include a dielectric substrate 410, a first leadframe portion 420a, a second leadframe portion 420b, a first semiconductor die 430, a second semiconductor die 440, wire bonds 450 and a molding compound 460. The substrate 410 can have a first surface (upward facing in FIG. 4) and a second surface opposite the first surface (downward facing in FIG. 4). As shown in FIG. 4, the substrate 410 can have printed circuit features 412 defined thereon, which can include copper traces (e.g., forming capacitor electrodes and/or attachment pads for coupling the substrate 410 with the leadframe portions 420a and 420b) and vias through the substrate 410. The printed circuit features 412 can define, on the substrate 410, a first unidirectional isolation channel an input terminal and an output terminal, such as discussed above with respect to FIGS. 1 and 2. The printed circuit features 412 can also define, on the substrate 410, a second unidirectional isolation channel an input terminal and an output terminal.

As shown in FIG. 4, the first leadframe portion 420a can include a plurality of signal leads that are linearly arranged along a first edge 421 of the assembly 400, while the second leadframe portion 420b includes a second plurality of signal leads are linearly arranged along a second edge 423 of the assembly 400. As shown in FIG. 4, the signal leads 422, 424, 426 and 428, which are at the ends of edges 421 and 423 (e.g., at the corners of the assembly 400) extend into the molding compound 460 and are coupled with the first (upward-facing) surface of the substrate 410, e.g. at respective corners of the first surface of the substrate 410. As also shown in FIG. 4, the other signal leads of the leadframe portions 420a and 420b, other than the signal leads 422, 424, 426 and 428, extend into the molding compound 460 put are pulled back from (spaced from, laterally space from, not in physical contact with, etc.) the substrate 410.

As shown in FIG. 4, the first semiconductor die 430 and the second semiconductor die 440 are disposed on the signal leads 422, 424, 426 and 428 (e.g., on surfaces that are opposite the surfaces coupled with the substrate 410. The wire bonds 450 electrically couple the first and second semiconductor die with the substrate 410 (e.g., with the input and output terminals of the isolation channels), and with the signal leads of the leadframe portions 420a and 420b.

As shown in FIG. 5, the assembly 500 can include a dielectric substrate 510, a first leadframe portion 520a, a second leadframe portion 520b, a first semiconductor die 530, a second semiconductor die 540, wire bonds 550 and a molding compound 560. The substrate 510 can have a first surface (downward facing in FIG. 5) and a second surface opposite the first surface (upward facing in FIG. 5). As shown in FIG. 5, the substrate 510 can have printed circuit features 512 defined thereon, which can include copper traces (e.g., forming capacitor electrodes and/or attachment pads for coupling the substrate 510 with the leadframe portions 520a and 520b) and vias through the substrate 510. The printed circuit features 512 can define, on the substrate 510, a first unidirectional isolation channel an input terminal and an output terminal, such as discussed above with respect to FIGS. 1 and 2. The printed circuit features 512 can also define, on the substrate 510, a second unidirectional isolation channel an input terminal and an output terminal.

As shown in FIG. 5, the first leadframe portion 520a can include a plurality of signal leads that are linearly arranged along a first edge 521 of the assembly 500, while the second leadframe portion 520b includes a second plurality of signal leads are linearly arranged along a second edge 523 of the assembly 500. As shown in FIG. 5, the signal leads 522, 524, 526 and 528, which are at the ends of edges 521 and 523 (e.g., at the corners of the assembly 500) extend into the molding compound 560 and are coupled with the first (downward-facing) surface of the substrate 510, e.g. at respective corners of the first surface of the substrate 410. As also shown in FIG. 5, the other signal leads of the leadframe portions 520a and 520b, other than the signal leads 522, 524, 526 and 528, extend into the molding compound 560 put are pulled back from (spaced from, laterally space from, not in physical contact with, etc.) the substrate 510.

As shown in FIG. 5, the first semiconductor die 530 and the second semiconductor die 540 are disposed on the signal leads 522, 524, 526 and 528 (e.g., on same surfaces that are coupled with the substrate 510. The wire bonds 550 electrically couple the first and second semiconductor die with the substrate 510 (e.g., with the input and output terminals of the isolation channels), and with the signal leads of the leadframe portions 520a and 520b.

As indicated above, the assembly 300 corresponds with the assembly 600 in FIGS. 6A-6C, the assembly 400 corresponds with the assembly 800 of FIGS. 8A-C, and the assembly 500 of FIG. 5, corresponds with the assembly 900 of FIGS. 9A-9C. Further, the assemblies 700, 1000 and 1100 of, respectively, FIGS. 7A-7C, 10A-10C and 11 are variations of the assemblies 300, 400 and 500. Accordingly, for purposes of brevity, the details of each of these assemblies are not described in detail in the discussion below.

FIGS. 6A, 6B and 6C are diagrams illustrating an electronic device assembly 600 that corresponds with the assembly 300 of FIG. 3. FIG. 6A is a top-side (live-bug) isometric view, FIG. 6B is a bottom-side (dead-bug) isometric view, and FIG. 6C is a side view of the assembly 600. The assembly 600 includes a substrate 610 (having printed circuit features 612), a first leadframe portion 620a, a second leadframe portion 620b, a first semiconductor die 630, a second semiconductor die 640, wire bonds 650 and a molding compound 660.

As shown in FIGS. 6A-6C, the signal leads 622, 624, 626 and 628 extend into the molding compound 660 and are coupled with respective corners of the substrate 610 on a first surface of the substrate 610. As also shown in FIGS. 6A-6C, the first and second semiconductor die 630 and 640 are also disposed on the first surface of the substrate 610, e.g., respectively between the signal leads 622 and 624, and between the signal leads 626 and 628.

Figure 7B:
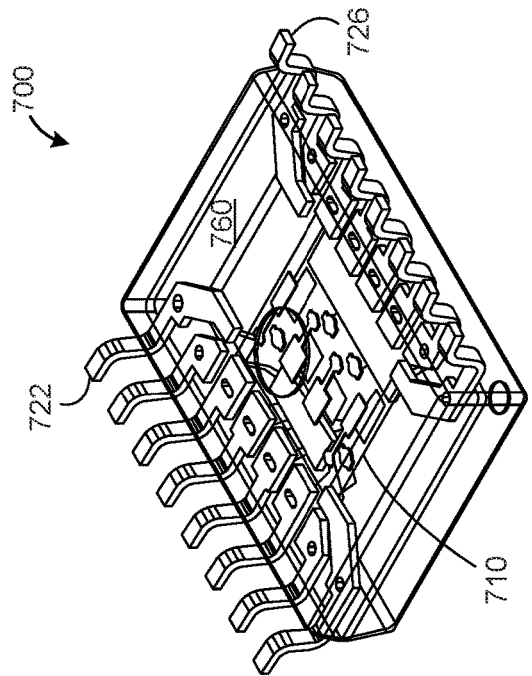
FIGS. 7A, 7B and 7C are diagrams illustrating another electronic device assembly.
Figure 7A:
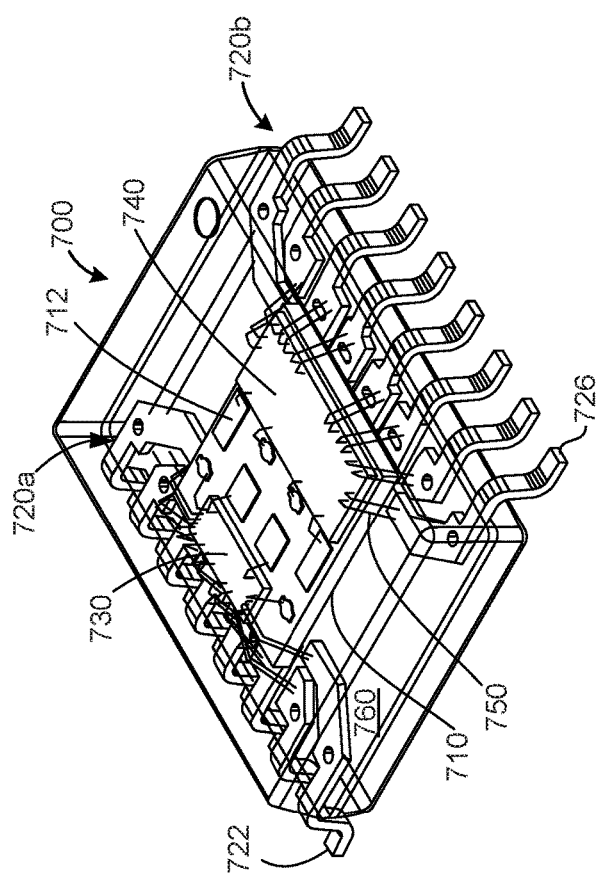
Figure 7C:
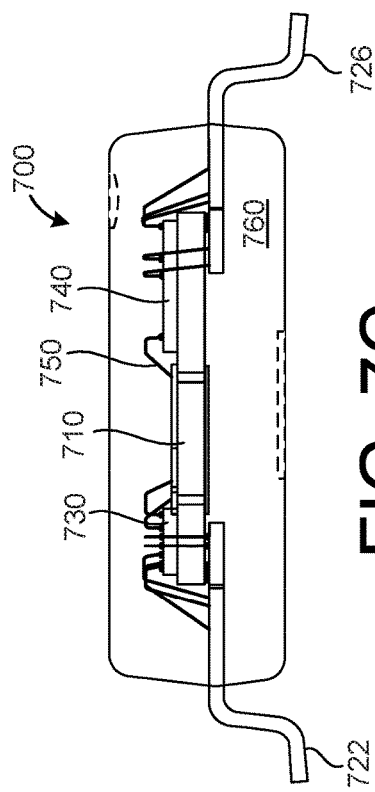

FIGS. 7A, 7B and 7C are diagrams illustrating an electronic device assembly 700 that can be a variation of the assembly 600. FIG. 7A is a top-side (live-bug) isometric view, FIG. 7B is a bottom-side (dead-bug) isometric view, and FIG. 7C is a side view of the assembly 700. The assembly 700 includes a substrate 710 (having printed circuit features 712), a first leadframe portion 720a, a second leadframe portion 720b, a first semiconductor die 730, a second semiconductor die 740, wire bonds 750 and a molding compound 760.

In FIGS. 7A-7C, the signal leads 722 and 726 are shown for orientation reference between the views of the FIGS. 7A-7C. As also shown in FIGS. 7A-7C, as compared to the assembly 600, the first and second semiconductor die 730 and 740 are disposed on a second surface of the substrate 710 that is opposite the first surface of the substrate 710 (e.g., the surface coupled with signal leads of the first leadframe portion 720a and the second leadframe portion 720b). As also compared with the assembly 600, the substrate 710 of the assembly 700 is coupled with signal leads that are centrally located in the linearly arranged signal leads of the first and second leadframe portions 720a and 720b, rather than the end (corner) signal leads. In some implementations, the leadframe portions 620a and 620b can be implemented in the assembly 700, e.g., in place of the leadframe portions 720a and 720b.

FIGS. 8A, 8B and 8C are diagrams illustrating an electronic device assembly 800 that corresponds with the assembly 400. FIG. 8A is a top-side (live-bug) isometric view, FIG. 8B is a bottom-side (dead-bug) isometric view, and FIG. 8C is a side view of the assembly 800. The assembly 800 includes a substrate 810 (having printed circuit features 812), a first leadframe portion 820a, a second leadframe portion 820b, a first semiconductor die 830, a second semiconductor die 840, wire bonds 850 and a molding compound 860.

As shown in FIGS. 8A-8C, signal leads 822, 824, 826 and 828 extend into the molding compound 860 and are coupled with respective corners of the substrate 810 on a first surface of the substrate 810. As also shown in FIGS. 8A-8C, the first semiconductor die 830 is disposed on opposite surfaces the signal leads 822 and 824 than are coupled with the substrate 810. Further in the assembly 800, the second semiconductor die 840 is disposed on the signal leads 826 and 828, on opposite surfaces of the signal leads 822 and 828 than are coupled with the substrate 810.

FIGS. 9A, 9B and 9C are diagrams illustrating an electronic device assembly 900 that corresponds with the assembly 500. FIG. 9A is a top-side (live-bug) isometric view, FIG. 9B is a bottom-side (dead-bug) isometric view, and FIG. 9C is a side view of the assembly 900. The assembly 900 includes a substrate 910 (having printed circuit features 912), a first leadframe portion 920a, a second leadframe portion 920b, a first semiconductor die 930, a second semiconductor die 940, wire bonds 950 and a molding compound 960.

As shown in FIGS. 9A-9C, signal leads 922, 924, 926 and 928 extend into the molding compound 960 and are coupled with respective corners of the substrate 910 on a first surface of the substrate 910. The signal leads 922 and 924 also define a die attach paddle for the first semiconductor die 930, while the signal leads 926 and 928 define a die attach paddle for the second semiconductor die 940. As shown in FIGS. 9A and 9C, the first semiconductor die 930 is disposed on the die attach paddle defined by the signal leads 922 and 924, on same surfaces of the signal leads 922 and 924 that are coupled with the substrate 910. Further in the assembly 900, the second semiconductor die 940 is disposed on the die attach paddle defined by the signal leads 926 and 928, on same surfaces of the signal leads 926 and 928 that are coupled with the substrate 910.

Figure 10B:
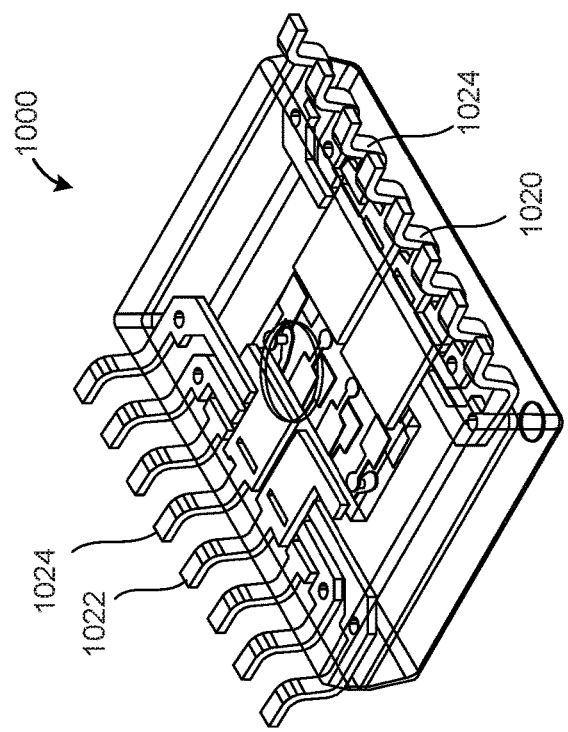
FIGS. 10A, 10B and 10C are diagrams illustrating another electronic device assembly.
Figure 10A:
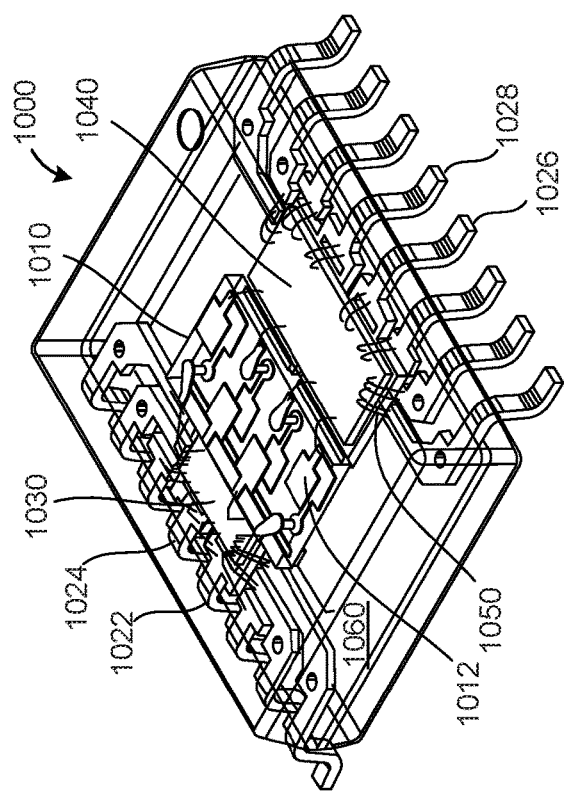
Figure 10C:
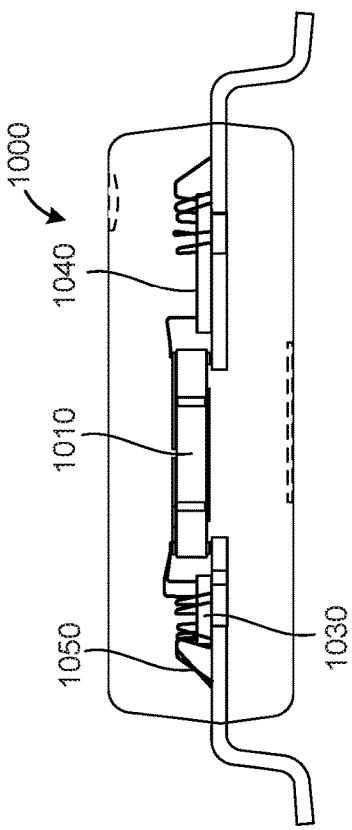

FIGS. 10A, 10B and 10C are diagrams illustrating an electronic device assembly 1000. FIG. 10A is a top-side (live-bug) isometric view, FIG. 10B is a bottom-side (dead-bug) isometric view, and FIG. 10C is a side view of the assembly 1000. The assembly 1000 includes a substrate 1010 (having printed circuit features 1012), a first leadframe portion 1020a, a second leadframe portion 1020b, a first semiconductor die 1030, a second semiconductor die 1040, wire bonds 1050 and a molding compound 1060.

As shown in FIGS. 10A-10B, signal leads 1022, 1024, 1024 and 1028 extend into the molding compound 1060 and are coupled with respective corners of the substrate 1010 on a first surface of the substrate 1010. The signal leads 1022 and 1024 are adjacent to each other and are centrally located in the linearly arranged signal leads of the leadframe portion 1020a. Likewise, the signal leads 1024 and 1026 are adjacent to each other and are centrally located in the linearly arranged signal leads of the leadframe portion 1020b.

The signal leads 1022 and 1024 also define a die attach paddle for the first semiconductor die 1030, while the signal leads 1026 and 1028 define a die attach paddle for the second semiconductor die 1040. As shown in FIG. 10A, the first semiconductor die 1030 is disposed on the die attach paddle defined by the signal leads 1022 and 1024, on same surfaces of the signal leads 1022 and 1024 that are coupled with the substrate 1010. Further in the assembly 1000, the second semiconductor die 1040 is disposed on the die attach paddle defined by the signal leads 1026 and 1028, on same surfaces of the signal leads 1022 and 1028 that are coupled with the substrate 1010.

Figure 11:
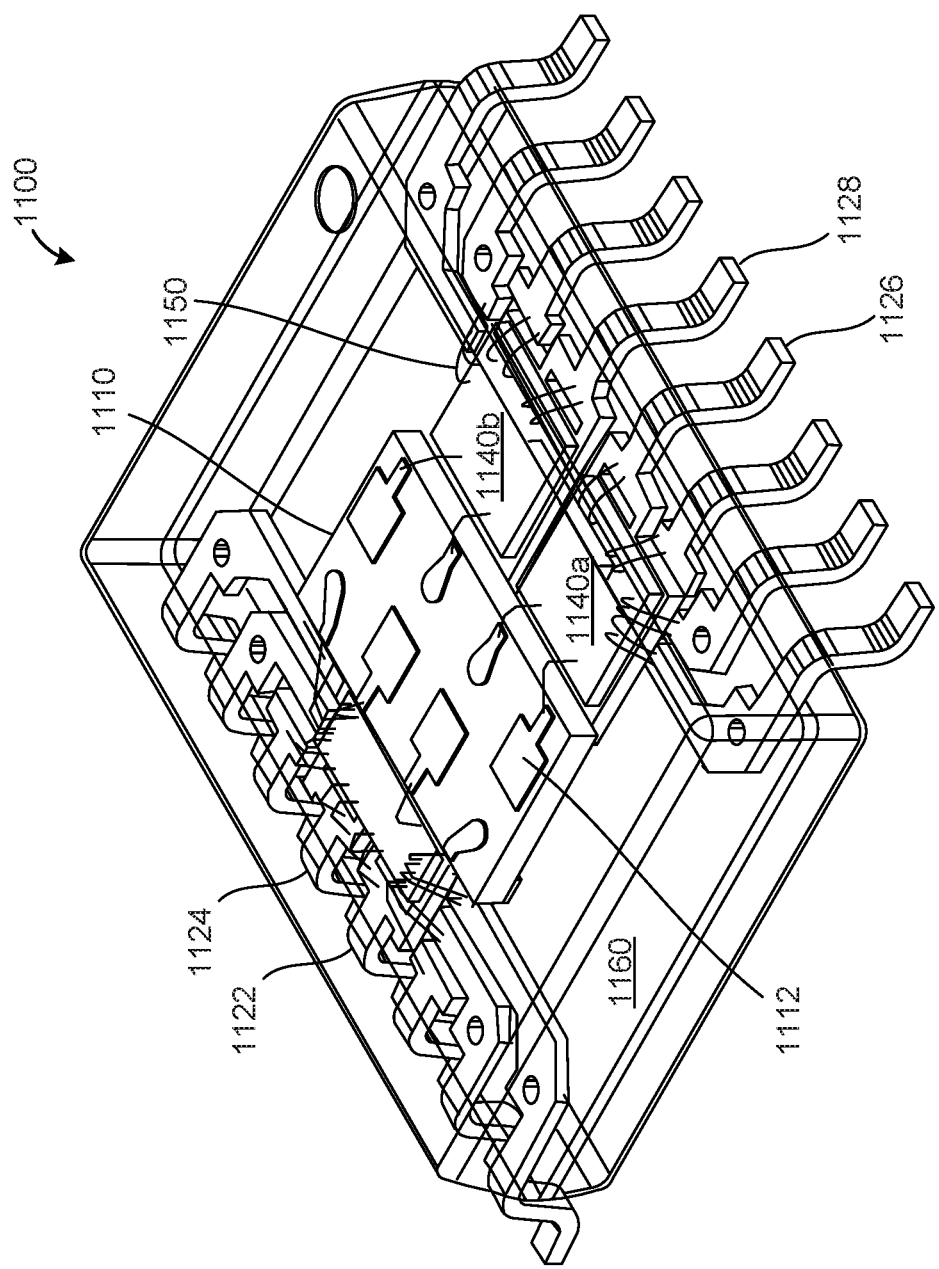
FIG. 11 is a diagram illustrating another electronic device assembly.

FIG. 11 is a diagram top-view (live-bug) isometric view of an electronic device assembly 1100 that is similar to the assembly 1100. The assembly 1100 includes a substrate 1110 (having printed circuit features 1112), a first leadframe portion 1120a, a second leadframe portion 1120b, a first semiconductor die 1030, a second semiconductor die 1140a, a third semiconductor die 1140b, wire bonds 1150 and a molding compound 1160. As shown in FIG. 11, signal leads 1122, 1124, 1126 and 1128 extend into the molding compound and are coupled with respective corners of the substrate 1110 on a first surface of the substrate 1110. The signal leads 1122 and 1124 are adjacent to each other and are centrally located in the linearly arranged signal leads of the leadframe portion 1120a. Likewise, the signal leads 1124 and 1126 are adjacent to each other and are centrally located in the linearly arranged signal leads of the leadframe portion 1120b.

The signal leads 1122 and 1124 also define a die attach paddle for the first semiconductor die 1030, while the signal lead 1126 defines a die attach paddle for the second semiconductor die 1140a, and the signal lead 1128 defines a die attach paddle for the third semiconductor die 1140b. As shown in FIG. 11, the first semiconductor die 1030 is disposed on the die attach paddle defined by the signal leads 1122 and 1124, on same surfaces of the signal leads 1122 and 1124 that are coupled with the substrate 1110. Further in the assembly 1000, the second semiconductor die 1140a is disposed on the die attach paddle defined by the signal lead 1126 on a same surface of the signal lead 1126 that is coupled with the substrate 1110. Also in the assembly 1100, the third semiconductor die 1140b is disposed on the die attach paddle defined by the signal lead 1128 on a same surface of the signal lead 1128 that is coupled with the substrate 1110.

Figure 12:
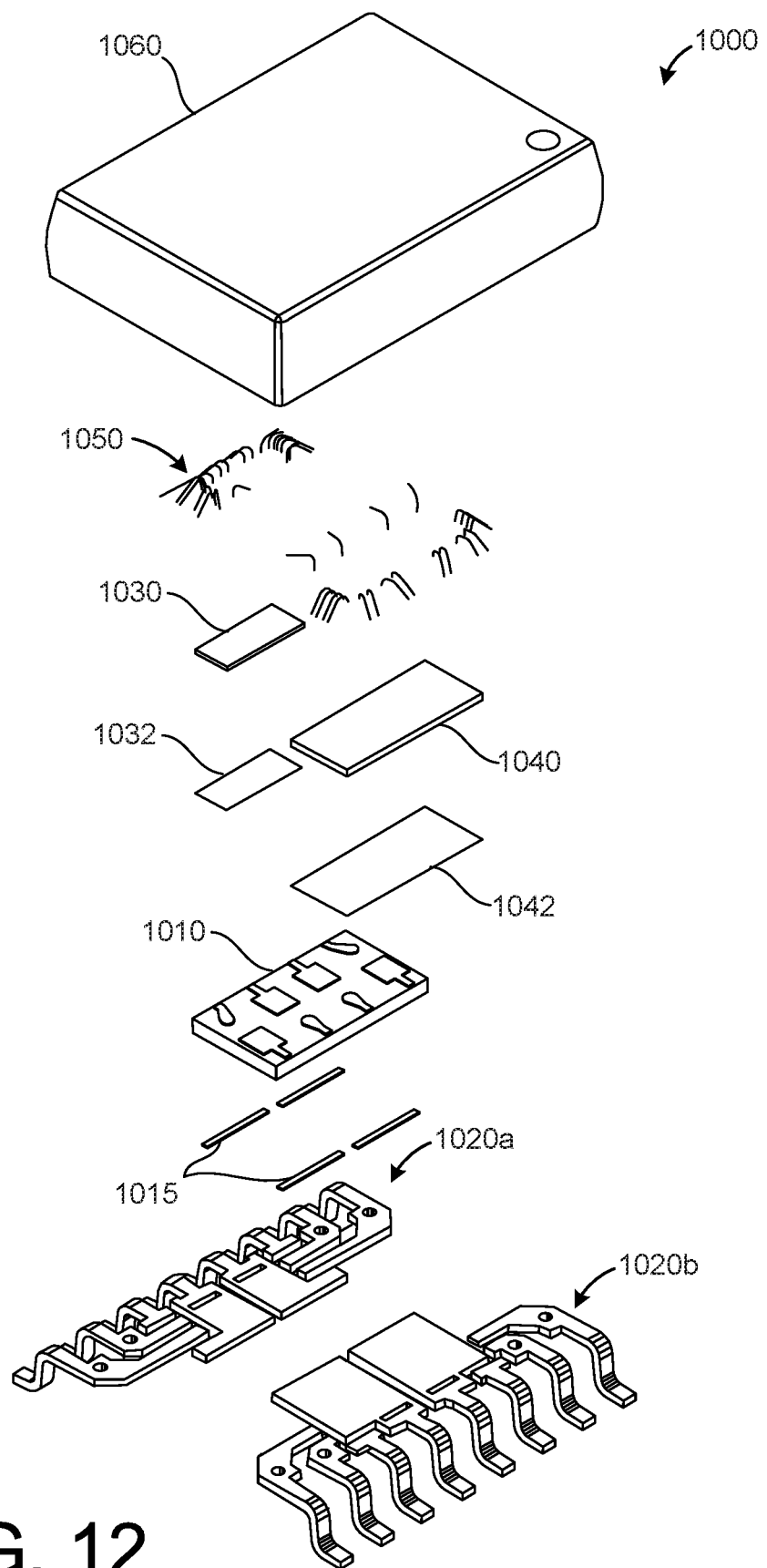
FIG. 12 is an exploded view of the electronic device assembly of FIG. 10.

FIG. 12 is an exploded view of the electronic device assembly 1000 of FIGS. 10A-10C. The exploded view of FIG. 12 illustrates the various elements of the assembly 1000. As shown in FIG. 12, the assembly 1000 includes the substrate 1010, the leadframe portions 1020a and 1020b, the semiconductor die 1030, the semiconductor die 1040, the wire bonds 1050 and the molding compound 1060. As shown in FIG. 12, the assembly 1000 can also include an adhesive 1015, which can be a solder, or other appropriate adhesive, that is used to couple the substrate 1010 with the leadframe portions 1020a and 1020b, such as in the arrangement shown in FIGS. 10A-10C. As discussed herein, the substrate 1010 can have printed circuit traces (e.g., Cu traces) that are used to couple (solder, etc.) the substrate 1010 to the leadframe portions 1020a and 1020b.

As further shown in FIG. 12, the assembly 1000 can also include die attach material 1032 and 1042, which can be solder, epoxy, die attach film (DAF), etc. Depending on the particular implementation, the die attach material 1032 and 1042 can be electrically conductive, or electrically non-conductive. For instance, use of conductive or non-conductive die attach material can depend on a particular circuit that is implemented in a semiconductor die being attached. In the assembly 1000, the die attach material 1032 can be used to couple the semiconductor die 1030 with the leadframe portion 1020a, such as in the arrangement shown in FIGS. 10A-10C. Further in the assembly 1000, the die attach material 1042 can be used to couple the semiconductor die 1040 with the leadframe portion 1020b, such as in the arrangement shown in FIGS. 10A-10C.

The wire bonds 1050 of the device 1000 can be used to electrically couple the semiconductor die 1030 and 1040 with the substrate 1010 and with signal leads of the leadframe portions 1020a and 1020b, such as in the arrangement shown in FIGS. 10A-10C. In the assembly 1000, as shown in the exploded view of FIG. 12, the molding compound 1060 is shown separately. However, in the device assembly 1000 (e.g., as shown in FIGS. 10A-10C), the molding compound 1060 can be used (e.g., in an initial liquid form that is then cured to a solid form) to encapsulate the substrate 1010, the semiconductor die 1030 and 1040, the wire bonds 1050, the adhesive 1015, the die attach material 1032 and 1042, as well as portions of the leadframe portions 1020a and 1020b.

Figure 13:
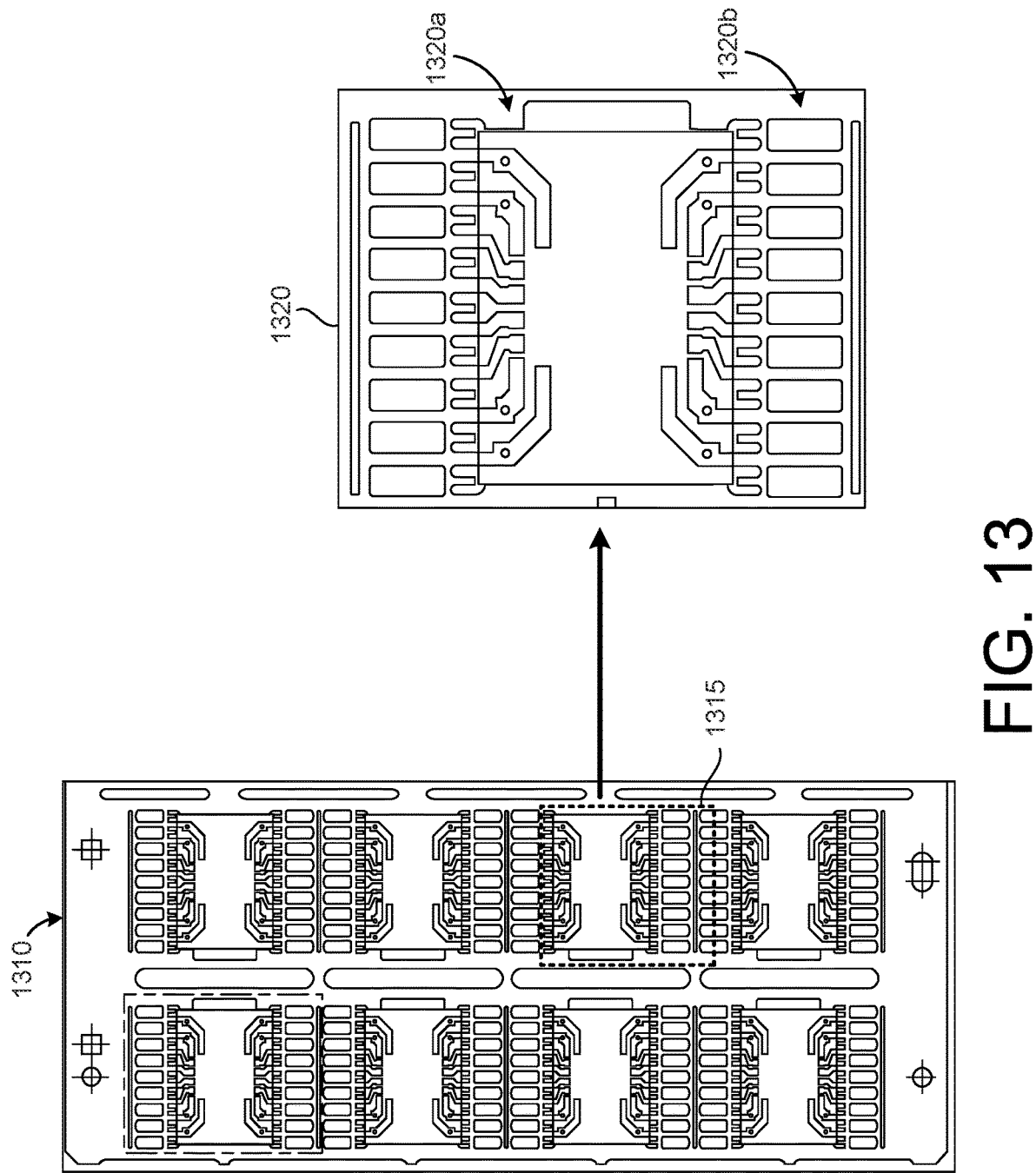
FIG. 13 is a diagram illustrating a strip of leadframes and a single leadframe of the strip.

FIG. 13 is a diagram illustrating a leadframe strip 1310 that includes a plurality of single leadframes 1320. The single leadframe 1320 (shown on the right side of FIG. 13) is indicated in the leadframe strip 1310 by the dashed line 1315 in FIG. 13. The single leadframe 1320 is also shown rotated 180 degrees on the horizontal from its orientation in the leadframe strip 1310. In some implementations, the leadframe 1320 can be used, for example, to implement the assembly 100 of FIG. 1, the assembly 300 of FIG. 3, the assembly 600 of FIGS. 6A-6C, and/or other electronic device assemblies.

As shown in FIG. 13, the leadframe 1320 can include a first leadframe portion 1320a and a second leadframe portion 1320b, such as the leadframe portions described herein. In some implementations, the leadframe strip 1310 can be included in a matrix of leadframes that includes a plurality of leadframe strip. The leadframe strip 1310 (or a matrix of leadframe strips) can be used to produce a plurality of assemblies (e.g., using a manufacturing process such as those described below with respect to FIGS. 13-17). As part of such a manufacturing process, individual assemblies can be singulated (separated, etc.) from the leadframe strip 1310, e.g., by separating each individual leadframe 1320 from the leadframe strip 1310.

FIGS. 14, 15, 16 and 17 are diagrams schematically illustrating, respectively, manufacturing process flows 1400, 1500, 1600 and 1700 for producing electronic device assemblies, such as the assemblies described herein. In the diagrams of FIG. 14-17, examples of various process operations are shown. The process operations of FIGS. 14-17 are illustrated, by way of example, using elements of, and/or illustrations of example electronic device assemblies. While specific reference numbers are not included for the assemblies and assembly elements in the process flows of FIGS. 14-17, it is noted that these process flows, or similar process flows, can be used to produce the assemblies described herein.

In some implementations, the process flows 1400-1700, or similar process flows, can be used to produce other electronic device assemblies. That is, while specific examples of assemblies are referenced with respect to the process flows 1400-1700, other electronic device assemblies can be produced using the process flows 1400-1700, or similar process flows. Accordingly, the process flows 1400-1700 are given by way of example. Also, in FIGS. 14-17, the process flows 1400-1700 are illustrated for a single electronic device assembly, though multiple assemblies (e.g., in a leadframe strip) can be produced in parallel using the processes, which are then separated (singulated) into individual assemblies as part of the manufacturing process flows.

Figure 14:
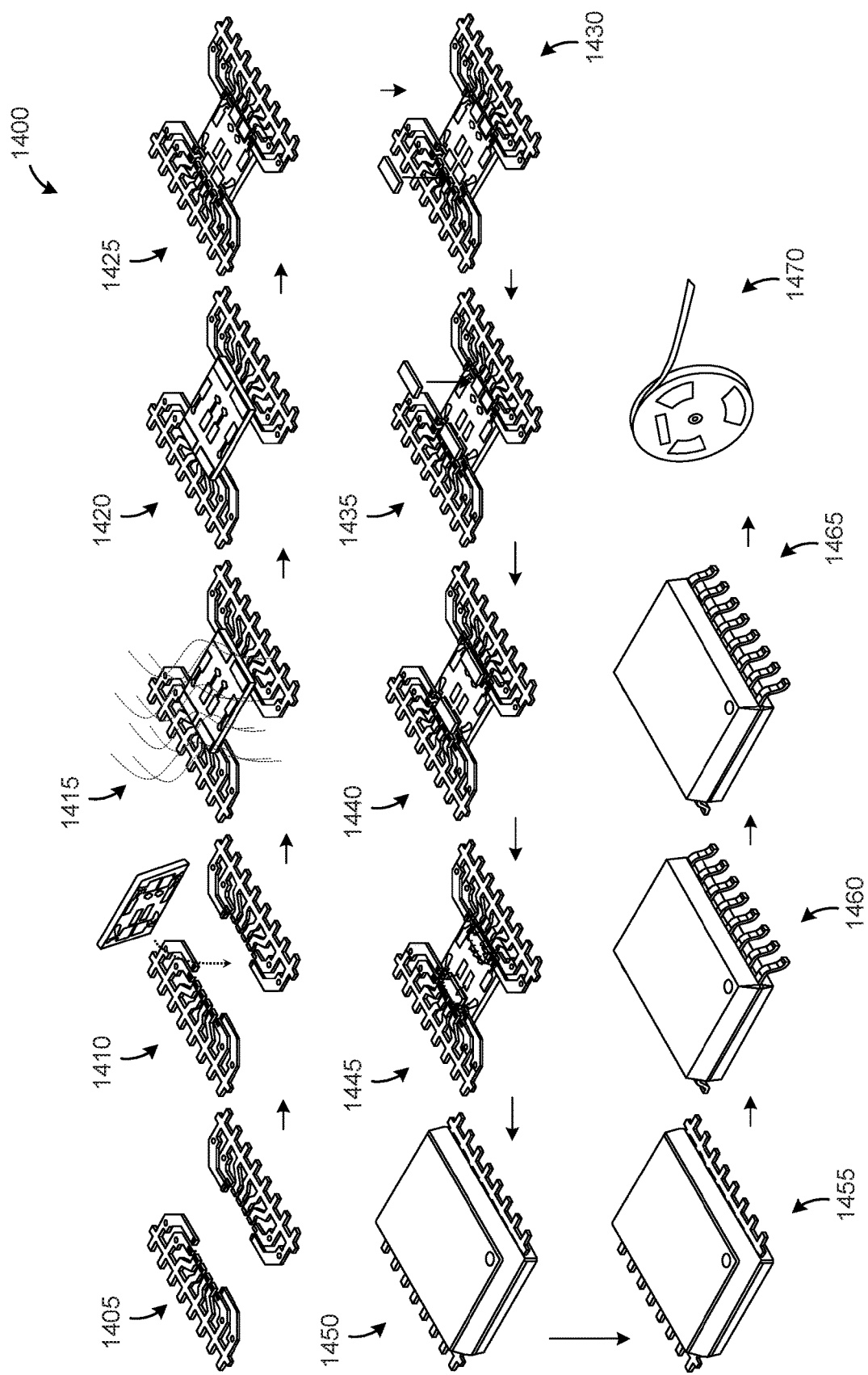
FIGS. 14, 15, 16 and 17 are diagrams illustrating manufacturing process flows for producing electronic device assemblies.

Referring to FIG. 14, the process flow 1400 is illustrated. In some implementations, the process flow 1400 of FIG. 14 can be used to produce, for example, the assemblies 100, 300 and 600 described above. In the process flow 1400, at process operation (operation) 1405, a solder print can be performed on a leadframe, where solder from the solder print will be used to attach a substrate to the leadframe. At operation 1410, a ceramic substrate (or other dielectric substrate) can be flip attached to (attached to, disposed on, etc.) the solder from the solder print at operation 1405. At operation 1415, a solder reflow process can be performed to reflow the solder from the solder print operation 1405, e.g., to fixedly couple the substrate with the leadframe. A flux clean can be performed at operation 1420 to remove residual solder flux from the solder reflow operation 1415.

At operation 1425, a non-conductive epoxy can be dispensed on the substrate, where the non-conductive epoxy will be used for coupling (attaching, etc.) semiconductor die to the substrate. In some implementations, a conductive adhesive (epoxy, solder, etc.) can be used. In some implementations, a die attach film (conductive or non-conductive) can be used, and operation 1425 can be omitted. At operation 1430, in this example, a first semiconductor die can be attached to (coupled with, disposed on, etc.) the substrate using the non-conductive epoxy of operation 1425. At operation 1435, in this example, a second semiconductor die can be attached to (coupled with, disposed on, etc.) the substrate using the non-conductive epoxy of operation 1425. At operation 1440, a die attach cure (e.g., a bake) can be performed, to cure the non-conductive epoxy of operation 1425 and fixedly couple (attach, etc.) the first and second semiconductor die with the substrate.

At operation 1445, thermosonic wire bonding can be performed to electrically couple the first and second semiconductor die with the substrate (e.g., with isolation channels formed on the substrate) and with signal leads of the leadframe. At operation 1450, a plasma clean process can be performed prior to performing a transfer molding and post mold cure process. The molding process of operation 1450 can encapsulate the assembly, other than exposed portions of the leadframe, in a molding compound, such as an epoxy molding compound. At operation 1455, a deflashing process can be performed to prepare the exposed portions of the leadframe for plating (e.g., to remove burrs, etc.). Also at operation, 1455 the exposed portions of the leadframe can be plated (e.g., solder plated) and a stress relief bake can be performed.

At operation 1460, degate-deflash-dejunk (DDD), trim and form of signal leads and singulation of individual assemblies, e.g., from a leadframe strip, can be performed. At operation 1465, functional and electrical testing (e.g., high voltage and direct current testing) can be performed on the assembly, and the assembly can be marked (e.g., with a part number, etc.). At operation 1470, a finishing process can be performed, including packaging the produced assembly for shipment (e.g., using a tape and reel).

Figure 15:
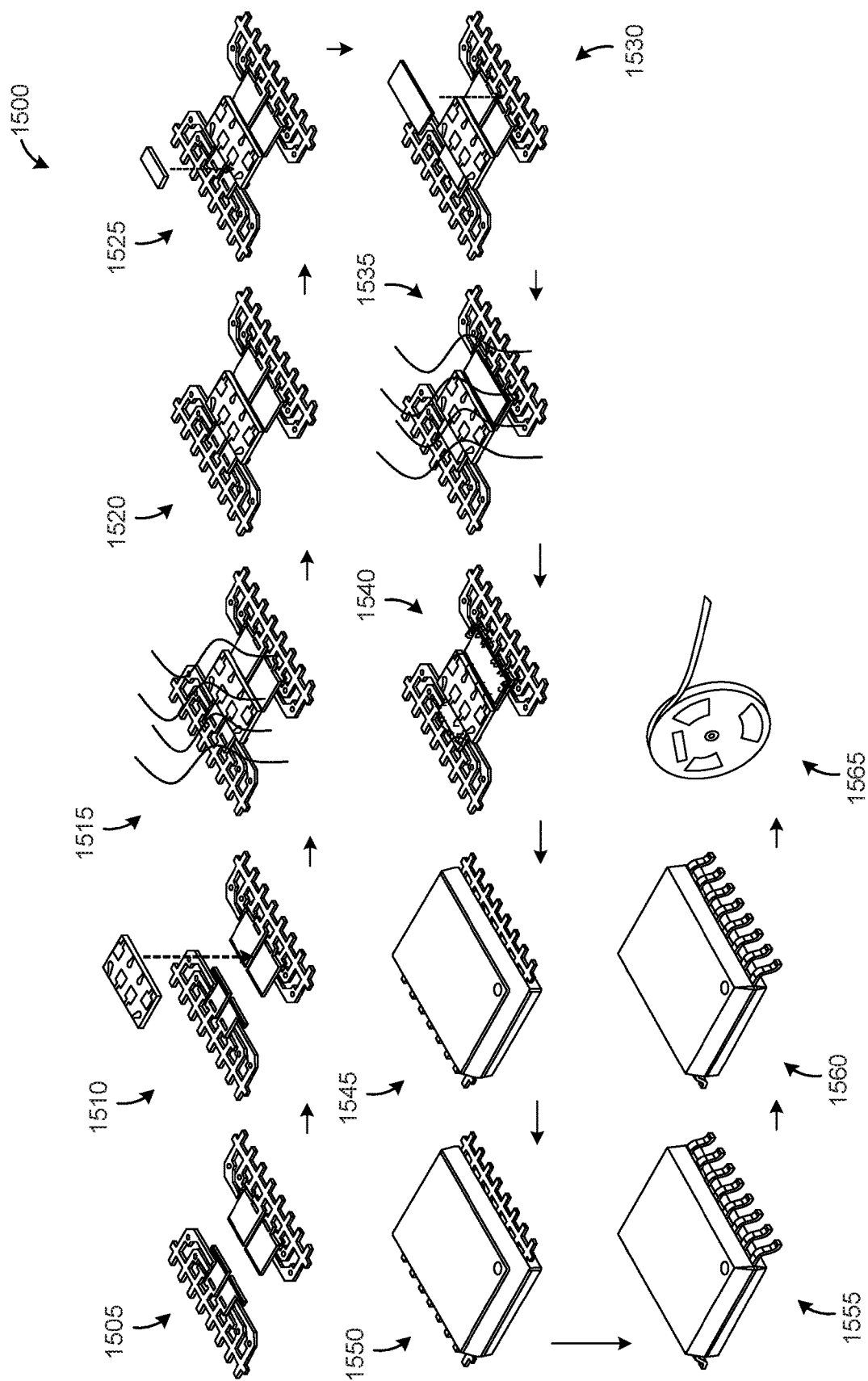

Referring to FIG. 15, the process flow 1500 is illustrated. In some implementations, the process flow 1500 of FIG. 15 can be used to produce, for example, the assemblies 200 and 1000 described above. In the process flow 1500, at process operation (operation) 1505, a solder print (or other adhesive print) can be performed on a leadframe, where the solder or adhesive will be used to attach a substrate to the leadframe. At operation 1510, a ceramic substrate (or other dielectric substrate) can be attached to (disposed on, etc.) the solder or adhesive from operation 1505. At operation 1515, a solder reflow or adhesive cure process can be performed to reflow the solder or cure the adhesive from operation 1505, e.g., to fixedly couple the substrate with the leadframe. A flux clean can be performed at operation 1520 to remove residual solder flux from the solder reflow operation 1515. In some implementations, such as implementations using an adhesive other than solder, operation 1520 can be omitted.

At operation 1525, a first semiconductor die can be attached to (coupled with, disposed on, etc.) the leadframe using a (conductive or non-conductive) die attach film. At operation 1530, in this example, a second semiconductor die can be attached to (coupled with, disposed on, etc.) the leadframe using a (conductive or non-conductive) die attach film. At operation 1535, a die attach cure (e.g., a bake) can be performed, to cure the die attach films (of operations 1525 and 1530) and fixedly couple (attach, etc.) the first and second semiconductor die with the leadframe.

At operation 1540, thermosonic wire bonding can be performed to electrically couple the first and second semiconductor die with the substrate (e.g., with isolation channels formed on the substrate) and with signal leads of the leadframe. At operation 1545, a plasma clean process can be performed prior to performing a transfer molding and post mold cure process. The molding process of operation 1545 can encapsulate the assembly, other than exposed portions of the leadframe, in a molding compound, such as an epoxy molding compound.

At operation 1550, a deflashing process can be performed to prepare the exposed portions of the leadframe for plating (e.g., to remove burrs, etc.). Also at operation 1550, the exposed portions of the leadframe can be plated (e.g., solder plated) and a stress relief bake can be performed. At operation 1555, DDD, trim and form of signal leads and singulation of individual assemblies, e.g., from a leadframe strip, can be performed. At operation 1560, functional and electrical testing (e.g., high voltage and direct current testing) can be performed on the assembly, and the assembly can be marked (e.g., with a part number, etc.). At operation 1565, a finishing process can be performed, including packaging the produced assembly for shipment (e.g., using a tape and reel).

Figure 16:
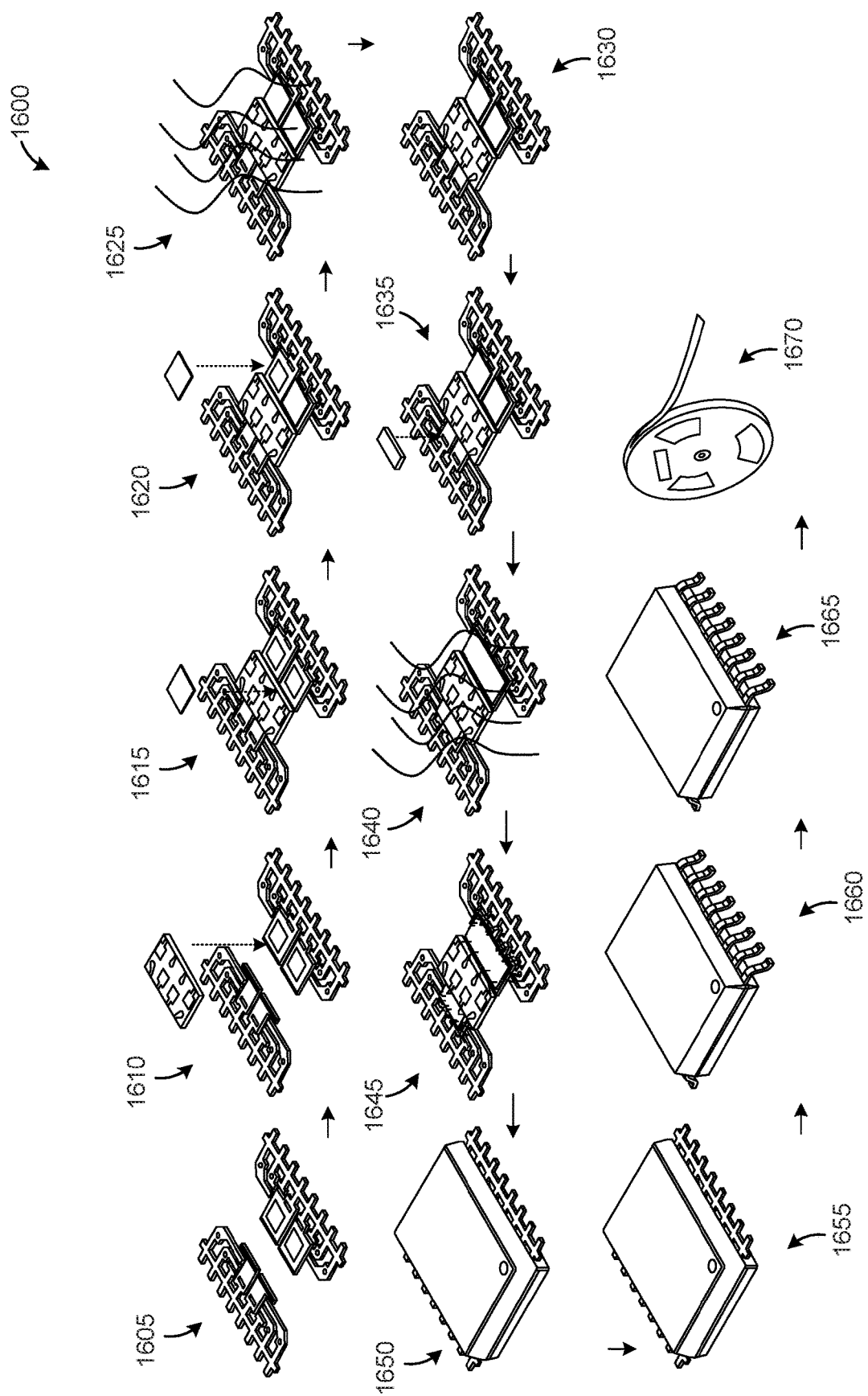

Referring to FIG. 16, the process flow 1600 is illustrated. In some implementations, the process flow 1600 of FIG. 16 can be used to produce, for example, the assemblies 200 and 1100 described above. In FIG. 16, an implementation of a power converter electronic device assembly (having a control IC, a low-side metal-oxide-semiconductor field-effect transistor (MOSFET) IC, and a high-side MOSFET IC) is shown by way of example. In some implementations, the process flow 1600 can be used to produce other electronic device assemblies.

In the process flow 1600, at process operation (operation) 1605, a solder print can be performed on a leadframe, where the solder will be used to couple (attach, etc.) a substrate to the leadframe, as well as to couple (attach, etc.) the low-side MOSFET IC and the high-side MOSFET IC to the leadframe. At operation 1610, a ceramic substrate (or other dielectric substrate) can be attached to (disposed on, etc.) the solder from operation 1605. At operation 1615, the low-side MOSFET IC (or, alternatively, the high-side MOSFET IC) can be attached to (disposed on, etc.) the solder from operation 1605. At operation 1620, the high-side MOSFET IC (or, alternatively, the low-side MOSFET IC) can be attached to (disposed on, etc.) the solder from operation 1605. At operation 1625, a solder reflow process can be performed to reflow the solder from operation 1605, e.g., to fixedly couple the substrate, the high-side MOSFET IC and the low-side MOSFET IC with the leadframe. A flux clean can be performed at operation 1630 to remove residual solder flux from the solder reflow operation 1625.

At operation 1635, the control IC can be couple with (attached to, disposed on, etc.) the leadframe using, for example a (conductive or non-conductive) die attach film or adhesive. At operation 1640, a die attach cure (e.g., a bake) can be performed, to cure the die attach film or adhesive of operation 1635, and fixedly couple (attach, etc.) the control IC with the leadframe.

At operation 1645, thermosonic wire bonding can be performed to electrically couple the low-side MOSFET, the high-side MOSFET and the control IC with the substrate (e.g., with isolation channels formed on the substrate) and with signal leads of the leadframe. At operation 1650, a plasma clean process can be performed prior to performing a transfer molding and post mold cure process. The molding process of operation 1650 can encapsulate the assembly, other than exposed portions of the leadframe, in a molding compound, such as an epoxy molding compound.

At operation 1655, a deflashing process can be performed to prepare the exposed portions of the leadframe for plating (e.g., to remove burrs, etc.). Also at operation 1655, the exposed portions of the leadframe can be plated (e.g., solder plated) and a stress relief bake can be performed. At operation 1660, DDD, trim and form of signal leads and singulation of individual assemblies, e.g., from a leadframe strip, can be performed. At operation 1665, functional and electrical testing (e.g., high voltage and direct current testing) can be performed on the assembly, and the assembly can be marked (e.g., with a part number, etc.). At operation 1670, a finishing process can be performed, including packaging the produced assembly for shipment (e.g., using a tape and reel).

Figure 17:
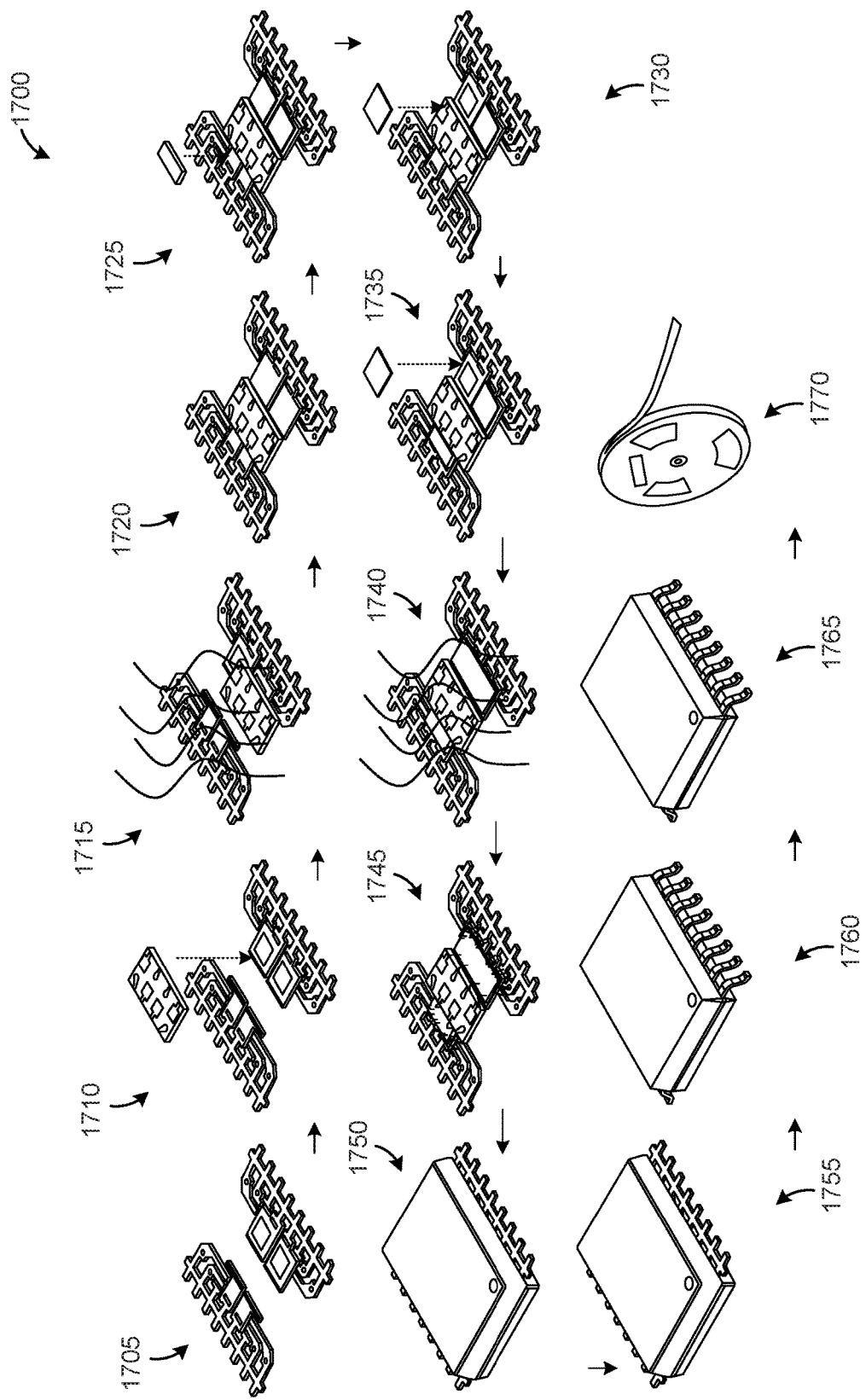

Referring to FIG. 17, the process flow 1700 is illustrated. As with the process flow 1600, in some implementations, the process flow 1700 of FIG. 17 can be used to produce, for example, the assemblies 200 and 1100 described above. As in FIG. 16, in FIG. 17, an implementation of a power converter electronic device assembly (having a control IC, a low-side MOSFET IC, and a high-side MOSFET IC) is shown by way of example. In some implementations, the process flow 1700 can be used to produce other electronic device assemblies.

In the process flow 1700, at operation 1705, a solder print (or other adhesive print) can be performed on a leadframe, where the solder or adhesive will be used to attach a substrate to the leadframe. At operation 1710, a ceramic substrate (or other dielectric substrate) can be attached to (disposed on, etc.) the solder or adhesive from operation 1705. At operation 1715, a solder reflow or adhesive cure process can be performed to reflow the solder or cure the adhesive from operation 1705, e.g., to fixedly couple the substrate with the leadframe. A flux clean can be performed at operation 1720 to remove residual solder flux from the solder reflow operation 1715. In some implementations, such as implementations using an adhesive other than solder, operation 1720 can be omitted.

At operation 1725, the control IC can be coupled with (attached to, disposed on, etc.) the leadframe using a (conductive or non-conductive) die attach film. At operation 1730, in this example, the low-side MOSFET IC can be attached to (coupled with, disposed on, etc.) the leadframe using a, for example, a (conductive or non-conductive) die attach film or other die attach adhesive. At operation 1735, in this example, the high-side MOSFET IC can be attached to (coupled with, disposed on, etc.) the leadframe using a, for example, a (conductive or non-conductive) die attach film or other die attach adhesive. In some implementations, the order the IC are coupled with the leadframe can vary. At operation 1740, a die attach cure (e.g., a bake) can be performed, to cure the die attach films and/or other die attach adhesives (of operations 1725, 1730 and 1735) and fixedly couple (attach, etc.) the control IC, the low-side MOSFET IC and the high-side MOSFET IC with the leadframe.

At operation 1745, thermosonic wire bonding can be performed to electrically couple the low-side MOSFET, the high-side MOSFET and the control IC with the substrate (e.g., with isolation channels formed on the substrate) and with signal leads of the leadframe. At operation 1750, a plasma clean process can be performed prior to performing a transfer molding and post mold cure process. The molding process of operation 1750 can encapsulate the assembly, other than exposed portions of the leadframe, in a molding compound, such as an epoxy molding compound.

At operation 1755, a deflashing process can be performed to prepare the exposed portions of the leadframe for plating (e.g., to remove burrs, etc.). Also at operation 1755, the exposed portions of the leadframe can be plated (e.g., solder plated) and a stress relief bake can be performed. At operation 1760, DDD, trim and form of signal leads and singulation of individual assemblies, e.g., from a leadframe strip, can be performed. At operation 1765, functional and electrical testing (e.g., high voltage and direct current testing) can be performed on the assembly, and the assembly can be marked (e.g., with a part number, etc.). At operation 1770, a finishing process can be performed, including packaging the produced assembly for shipment (e.g., using a tape and reel).

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Gallium Nitride (GaN), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An electronic device assembly comprising:
a dielectric substrate having a first surface and a second surface opposite the first surface, the dielectric substrate including:
a first unidirectional isolation channel defined thereon, the first unidirectional isolation channel having an input terminal and an output terminal; and
a second unidirectional isolation channel defined thereon, the second unidirectional isolation channel having an input terminal and an output terminal;
a leadframe including:
a first leadframe portion including a first plurality of signal leads, a first corner of the first surface of the dielectric substrate being disposed on and coupled with a first corner signal lead of the electronic device assembly, and a second corner of the first surface of the dielectric substrate being disposed on and coupled with a second corner signal lead of the electronic device assembly, signals leads of the first plurality of signal leads other than the first corner signal lead and the second corner signal lead being spaced from the dielectric substrate; and
a second leadframe portion including a second plurality of signal leads, a third corner of the first surface of the dielectric substrate being disposed on and coupled with a third corner signal lead of the electronic device assembly, and a fourth corner of the first surface of the dielectric substrate being disposed on and coupled with a fourth corner signal lead of the electronic device assembly, signal leads of the first plurality of signal leads other than the third corner signal lead and the fourth corner signal lead being spaced from the dielectric substrate;
a first semiconductor die disposed on the dielectric substrate, the first semiconductor die being electrically coupled, using respective wire bonds, with at least one signal lead of the first plurality of signal leads, the input terminal of the first unidirectional isolation channel, and the output terminal of the second unidirectional isolation channel; and
a second semiconductor die disposed on the dielectric substrate, the first semiconductor die being electrically coupled, using respective wire bonds, with at least one signal lead of the second plurality of signal leads, the output terminal of the first unidirectional isolation channel, and the input terminal of the second unidirectional isolation channel.

2. The electronic device assembly of claim 1, wherein the first semiconductor die and the second semiconductor die are disposed on the first surface of the dielectric substrate.

3. The electronic device assembly of claim 1, wherein the first semiconductor die and the second semiconductor die are disposed on the second surface of the dielectric substrate.

4. The electronic device assembly of claim 1, further comprising a third semiconductor die that is electrically coupled, using respective wire bonds, with at least one signal lead of the second plurality of signal leads and with the dielectric substrate.

5. The electronic device assembly of claim 1, wherein the first plurality of signal leads are linearly arranged along a first edge of the electronic device assembly and the second plurality of signal leads are linearly arranged along a second edge of the electronic device assembly,
the first corner signal lead being disposed at a first end of the first plurality of signal leads on the first edge of the electronic device assembly,
the second corner signal lead being disposed at a second end of the first plurality of signal leads on the first edge of the electronic device assembly,
the third corner signal lead being disposed at a first end of the second plurality of signal leads on the second edge of the electronic device assembly, and
the fourth corner signal lead being disposed at a second end of the second plurality of signal leads on the second edge of the electronic device assembly.

6. An electronic device assembly comprising:
a dielectric substrate having a first surface and a second surface opposite the first surface; and
a leadframe including:
a first leadframe portion including a first plurality of signal leads that are linearly arranged along a first edge of the electronic device assembly, a first corner of the first surface of the dielectric substrate being disposed on and coupled with a first signal lead of the first plurality of signal leads that is disposed at a first end of the first plurality of signal leads on the first edge of the electronic device assembly, and a second corner of the first surface of the dielectric substrate being disposed on and coupled with a second signal lead of the first plurality of signal leads that is disposed at a second end of the first plurality of signal leads on the first edge of the electronic device assembly, other signal leads of the first plurality of signal leads being spaced from the dielectric substrate; and
a second leadframe portion including a second plurality of signal leads that are linearly arranged along a second edge of the electronic device assembly, a third corner of the first surface of the dielectric substrate being disposed on and coupled with a first signal lead of the second plurality of signal leads that is disposed at a first end of the second plurality of signal leads on the second edge of the electronic device assembly, and a fourth corner of the first surface of the dielectric substrate being disposed on and coupled with a second signal lead of the second plurality of signal leads that is disposed at a second end of the second plurality of signal leads on the second edge of the electronic device assembly, other signal leads of the second plurality of signal leads being spaced from the dielectric substrate.

7. The electronic device assembly of claim 6, further comprising:
a first semiconductor die being electrically coupled, using respective wire bonds, with at least one signal lead of the first plurality of signal leads and the dielectric substrate; and
a second semiconductor die being electrically coupled, using respective wire bonds, with at least one signal lead of the second plurality of signal leads and the dielectric substrate.

8. The electronic device assembly of claim 7, wherein the first semiconductor die and the second semiconductor die are disposed on the first surface of the dielectric substrate.

9. An electronic device assembly comprising:
a dielectric substrate having a first surface and a second surface opposite the first surface;
a leadframe including:
a first leadframe portion including a first plurality of signal leads; and a second leadframe portion including a second plurality of signal leads,
the dielectric substrate being disposed on and coupled with a subset of the first plurality of signal leads and a subset of the second plurality of signal leads,
the subset of the first plurality of signal leads including a first corner lead of the electronic device assembly, and a second corner lead of the electronic device assembly,
the subset of the second plurality of signal leads including a third corner lead of the electronic device assembly, and a fourth corner lead of the electronic device assembly,
signal leads of the first plurality of signal leads, other than the subset of the first plurality of signal leads, being spaced from the dielectric substrate, and
signal leads of the second plurality of signal leads, other than the subset of the second plurality of signal leads, being spaced from the dielectric substrate;
a first semiconductor die disposed on the dielectric substrate, the first semiconductor die being electrically coupled, using respective wire bonds, with at least one signal lead of the first plurality of signal leads and the dielectric substrate; and
a second semiconductor die disposed on the dielectric substrate, the second semiconductor die being electrically coupled, using respective wire bonds, with at least one signal lead of the second plurality of signal leads and the dielectric substrate.

10. The electronic device assembly of claim 9, further comprising a molding compound encapsulating the dielectric substrate, the first semiconductor die, the second semiconductor die, the wire bonds, at least a portion of the first leadframe portion, and at least a portion of the second leadframe portion.

11. The electronic device assembly of claim 7, wherein the first semiconductor die and the second semiconductor die are disposed on the second surface of the dielectric substrate.

12. The electronic device assembly of claim 9, wherein:
the dielectric substrate is coupled with the subset of the first plurality of signal leads and the subset of the second plurality of signal leads on the first surface of the dielectric substrate; and
the first semiconductor die and the second semiconductor die are disposed on the first surface of the dielectric substrate.

13. The electronic device assembly of claim 9, wherein:
the dielectric substrate is coupled with the subset of the first plurality of signal leads and the subset of the second plurality of signal leads on the first surface of the dielectric substrate; and
the first semiconductor die and the second semiconductor die are disposed on the second surface of the dielectric substrate.

* * * * *